(12) United States Patent
Jerebic et al.

(10) Patent No.: US 9,368,700 B2
(45) Date of Patent: Jun. 14, 2016

(54) OPTOELECTRONIC COMPONENT AND METHOD FOR PRODUCING AN OPTOELECTRONIC COMPONENT

(75) Inventors: Simon Jerebic, Tegernheim (DE); Erik Heinemann, Regensburg (DE); Markus Pindl, Tegernheim (DE); Michael Bestele, Lappersdorf (DE); Jan Marfeld, Regensburg (DE)

(73) Assignee: OSRAM OPTO SEMICONDUCTORS GMBH, Regensburg (DE)

( * ) Notice: Subject to any disclaimer, the term of this patent is extended or adjusted under 35 U.S.C. 154(b) by 58 days.

(21) Appl. No.: 14/233,754

(22) PCT Filed: Jun. 27, 2012

(86) PCT No.: PCT/EP2012/062465
§ 371 (c)(1),
(2), (4) Date: Mar. 18, 2014

(87) PCT Pub. No.: WO2013/010765
PCT Pub. Date: Jan. 24, 2013

(65) Prior Publication Data
US 2014/0191272 A1    Jul. 10, 2014

(30) Foreign Application Priority Data
Jul. 19, 2011   (DE) .......................... 10 2011 079 403

(51) Int. Cl.
*H01L 33/54*   (2010.01)
*H01L 33/50*   (2010.01)
*H01L 33/60*   (2010.01)
*H01L 25/075*  (2006.01)

(52) U.S. Cl.
CPC .............. *H01L 33/508* (2013.01); *H01L 33/60* (2013.01); *H01L 25/0753* (2013.01); *H01L 2924/0002* (2013.01)

(58) Field of Classification Search
CPC ................................ H01L 33/54; H01L 33/60
See application file for complete search history.

(56) References Cited

U.S. PATENT DOCUMENTS

| | | |
|---|---|---|
| 2008/0308822 A1 | 12/2008 | Tsang et al. |
| 2009/0010017 A1 | 1/2009 | Hayashi et al. |
| 2010/0052002 A1 | 3/2010 | Owen et al. |
| 2010/0072416 A1 | 3/2010 | Fujioka et al. |
| 2010/0119238 A1* | 5/2010 | Tanaka ................... G02B 6/122 398/182 |
| 2010/0140648 A1 | 6/2010 | Harada et al. |
| 2013/0077280 A1* | 3/2013 | Bemmerl et al. ............. 361/807 |

FOREIGN PATENT DOCUMENTS

| | | |
|---|---|---|
| CN | 101325193 A | 12/2008 |
| CN | 101583670 A | 11/2009 |
| DE | 10229067 A1 | 1/2004 |
| DE | 102007029369 A1 | 1/2009 |
| DE | 202009005453 U1 | 9/2010 |
| DE | 102009039982 A1 | 3/2011 |

(Continued)

*Primary Examiner* — Mark Prenty
(74) *Attorney, Agent, or Firm* — Slater Matsil, LLP

(57) ABSTRACT

An optoelectronic component includes a substrate, on which a semiconductor chip and a wettable attractor element are arranged. A medium including pigments at least regionally covers the exposed region of the substrate that is not covered by the semiconductor chip and the attractor element. The medium at least partly wets the semiconductor chip and the attractor element.

13 Claims, 24 Drawing Sheets

(56) References Cited

FOREIGN PATENT DOCUMENTS

| EP | 2078736 | A1 | 7/2009 |
|---|---|---|---|
| KR | 101039994 | B1 | 6/2011 |
| WO | 2005081319 | A1 | 9/2005 |
| WO | 2009075530 | A2 | 6/2009 |
| WO | 2010017831 | A1 | 2/2010 |
| WO | 2011147636 | A1 | 12/2011 |

* cited by examiner

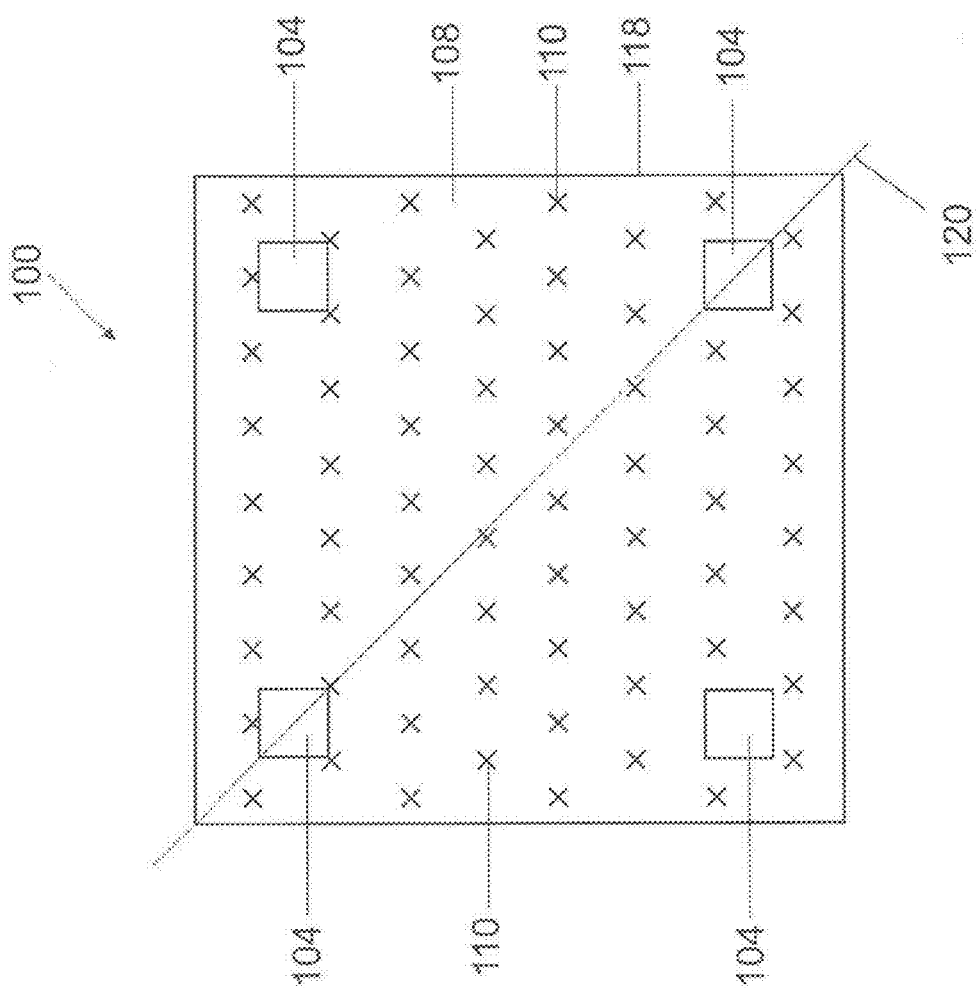

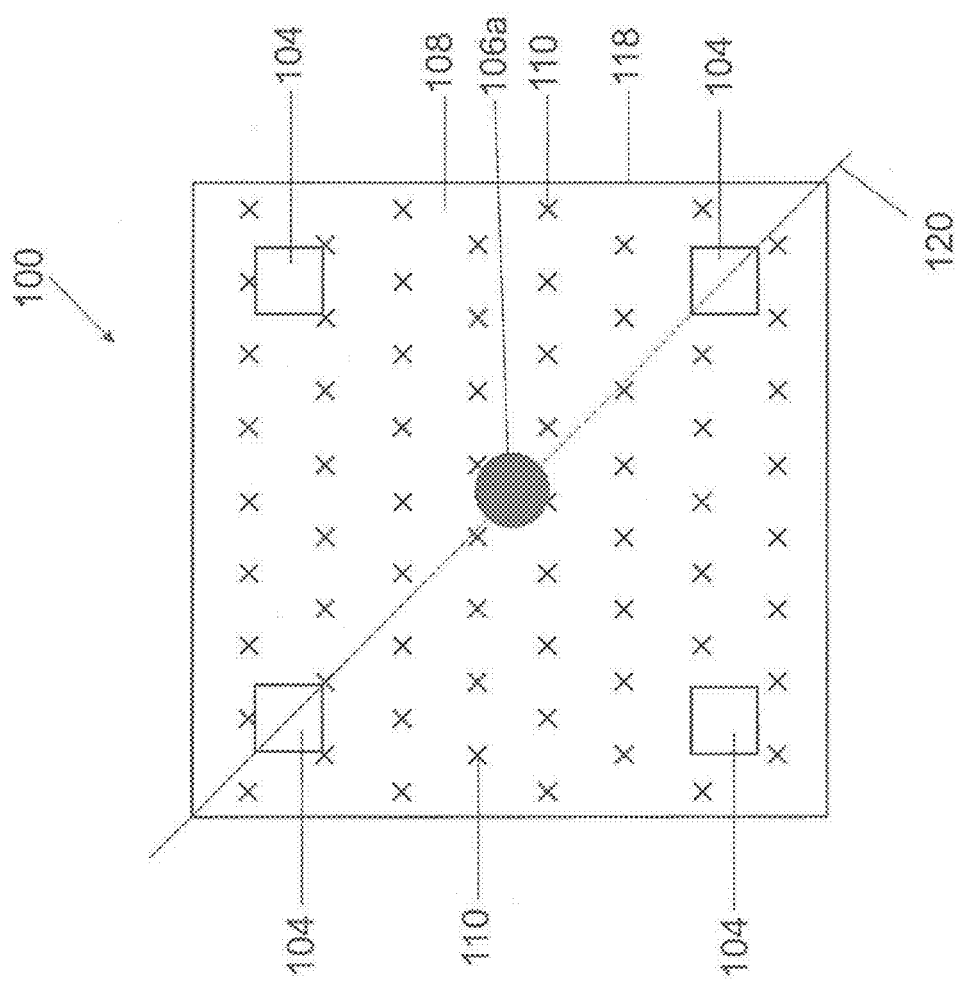

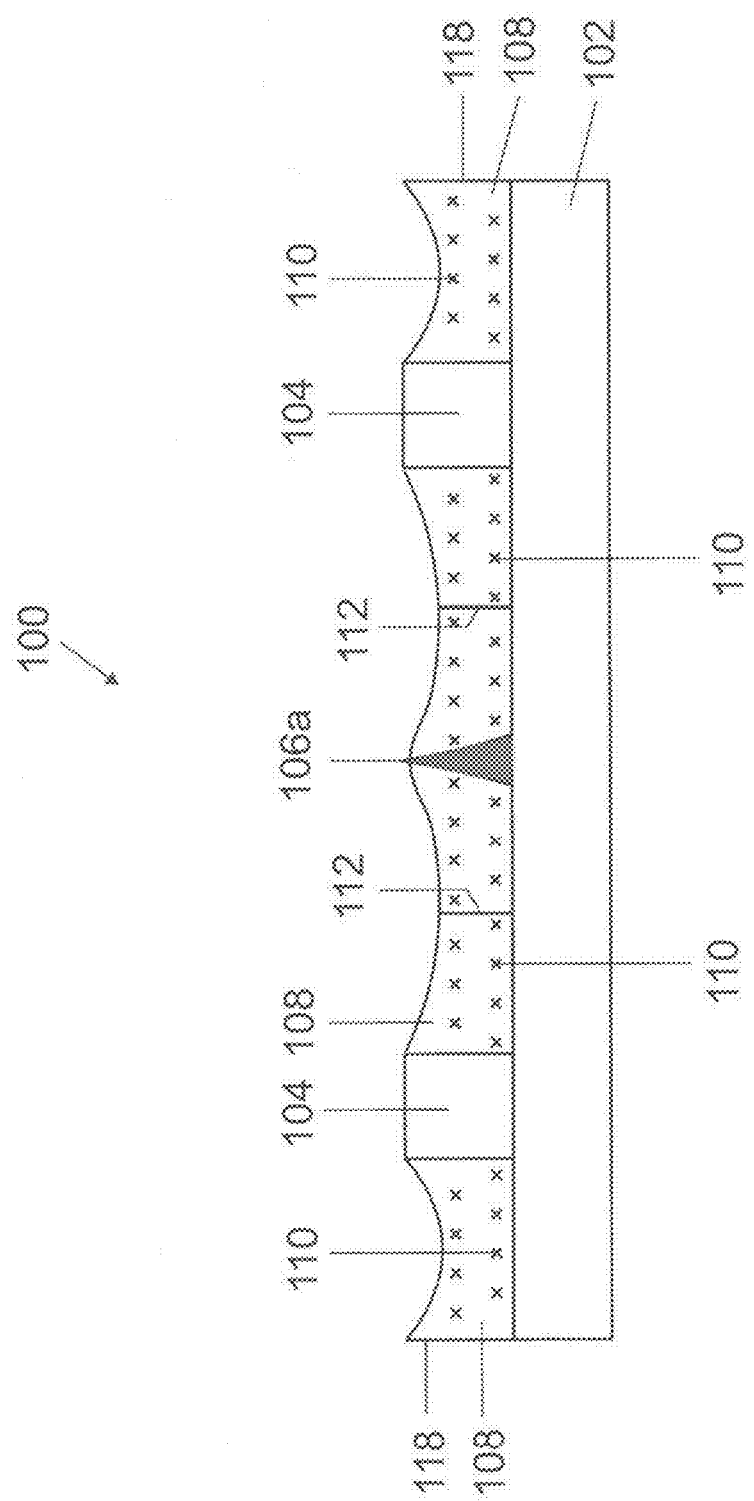

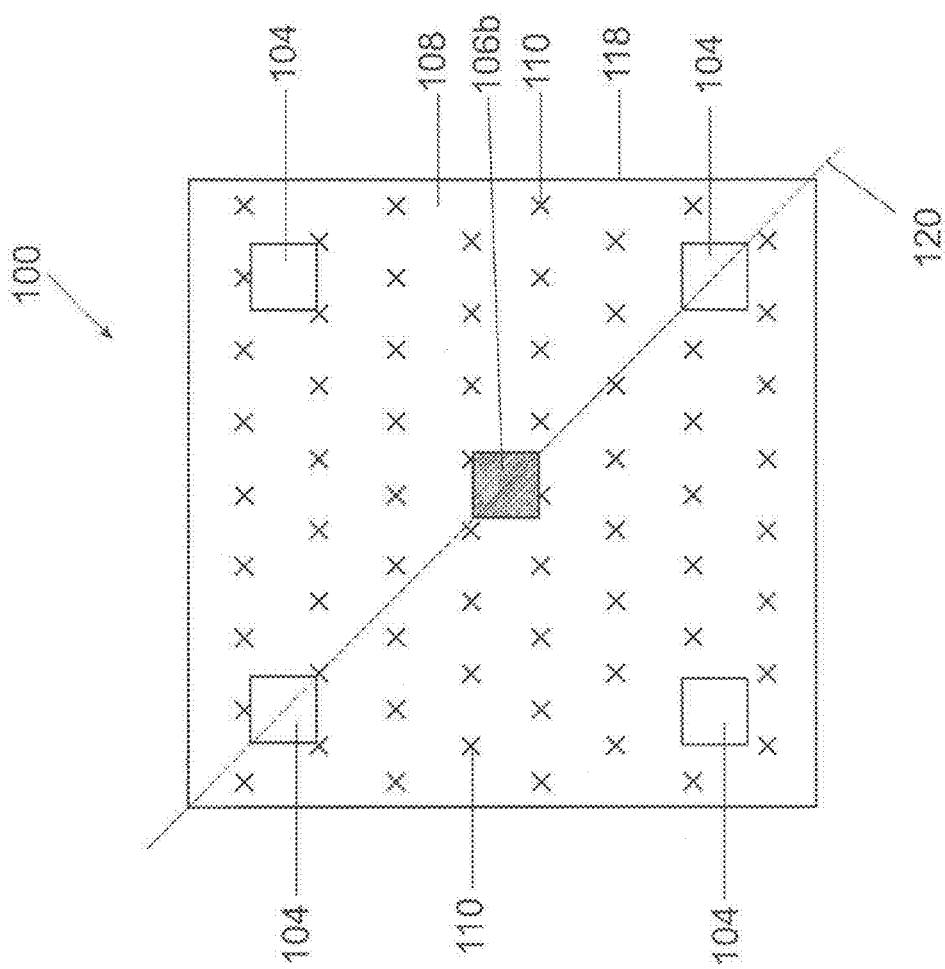

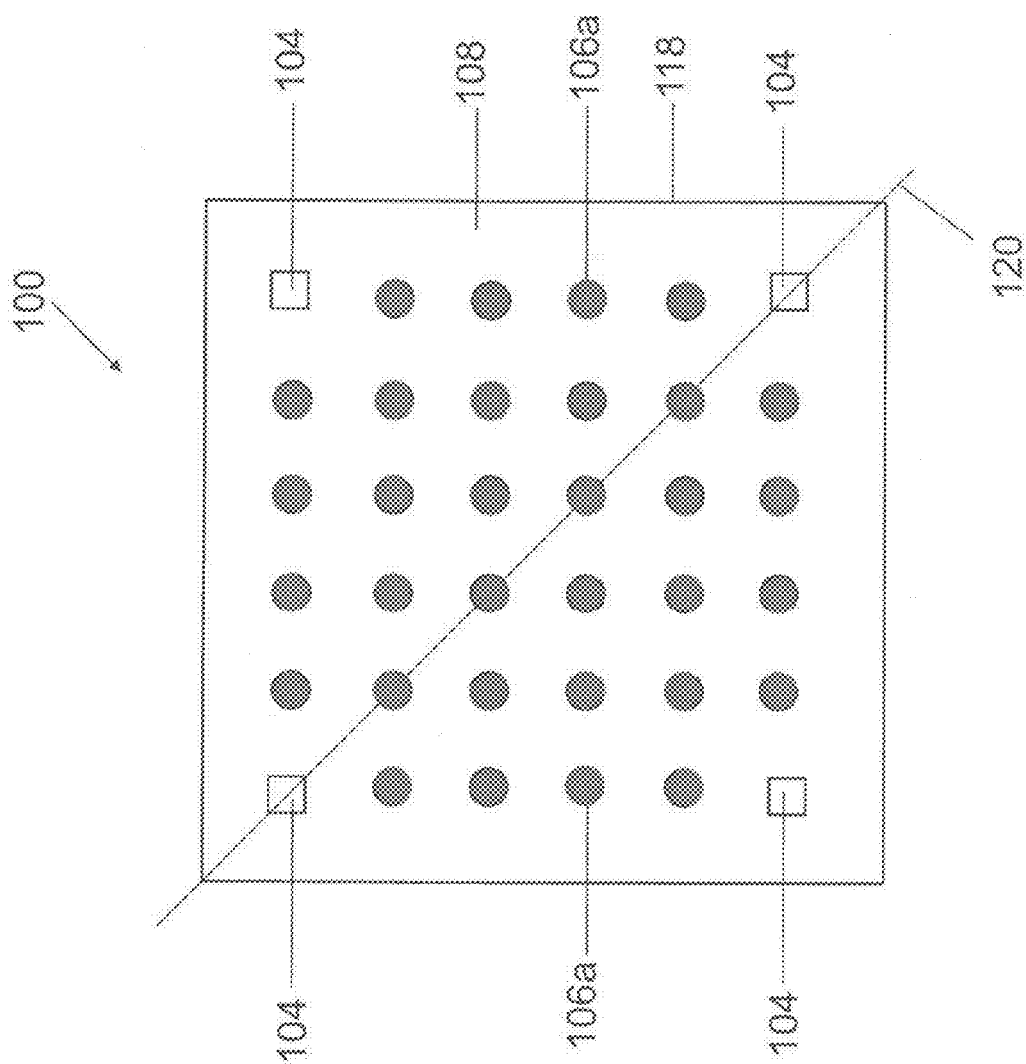

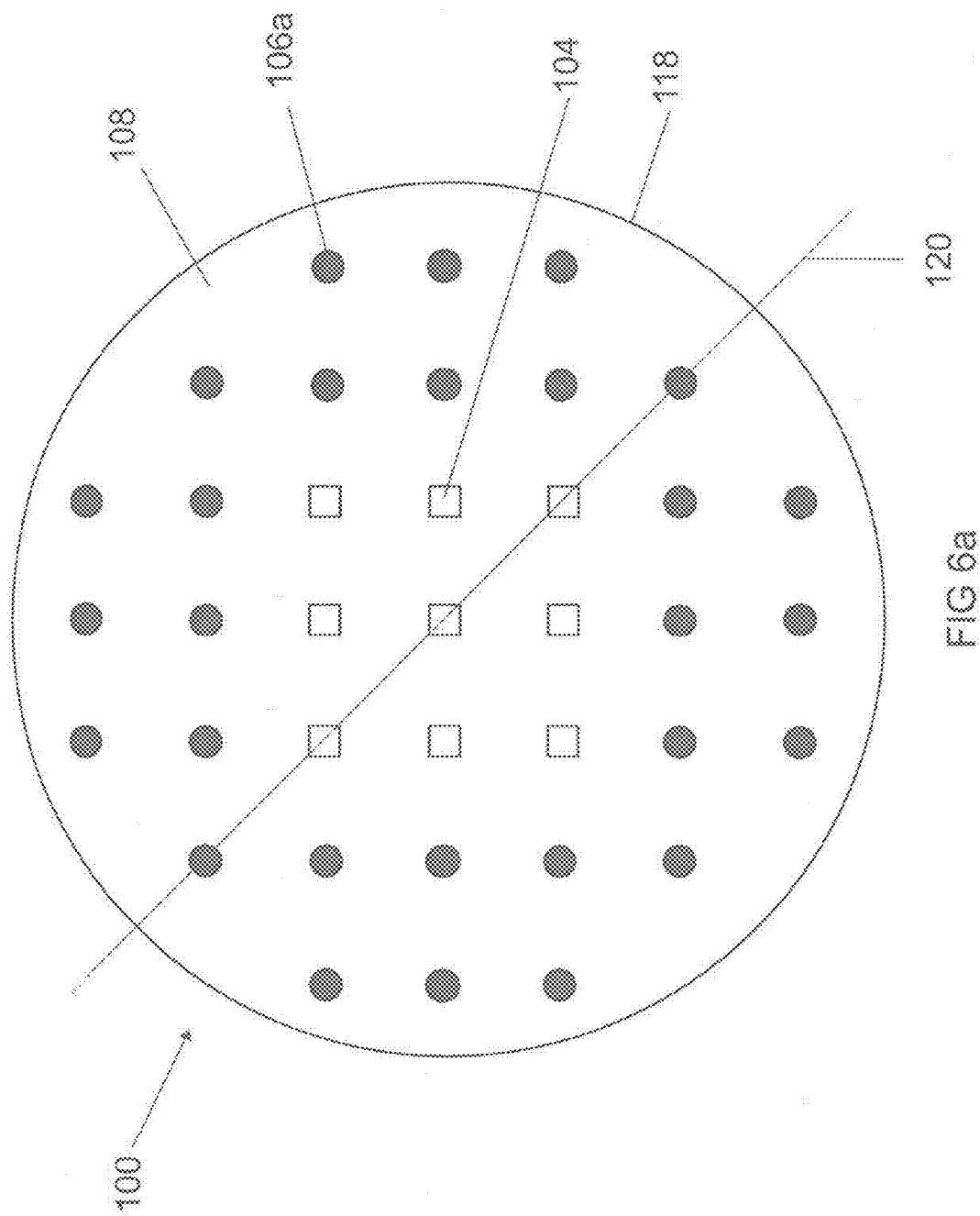

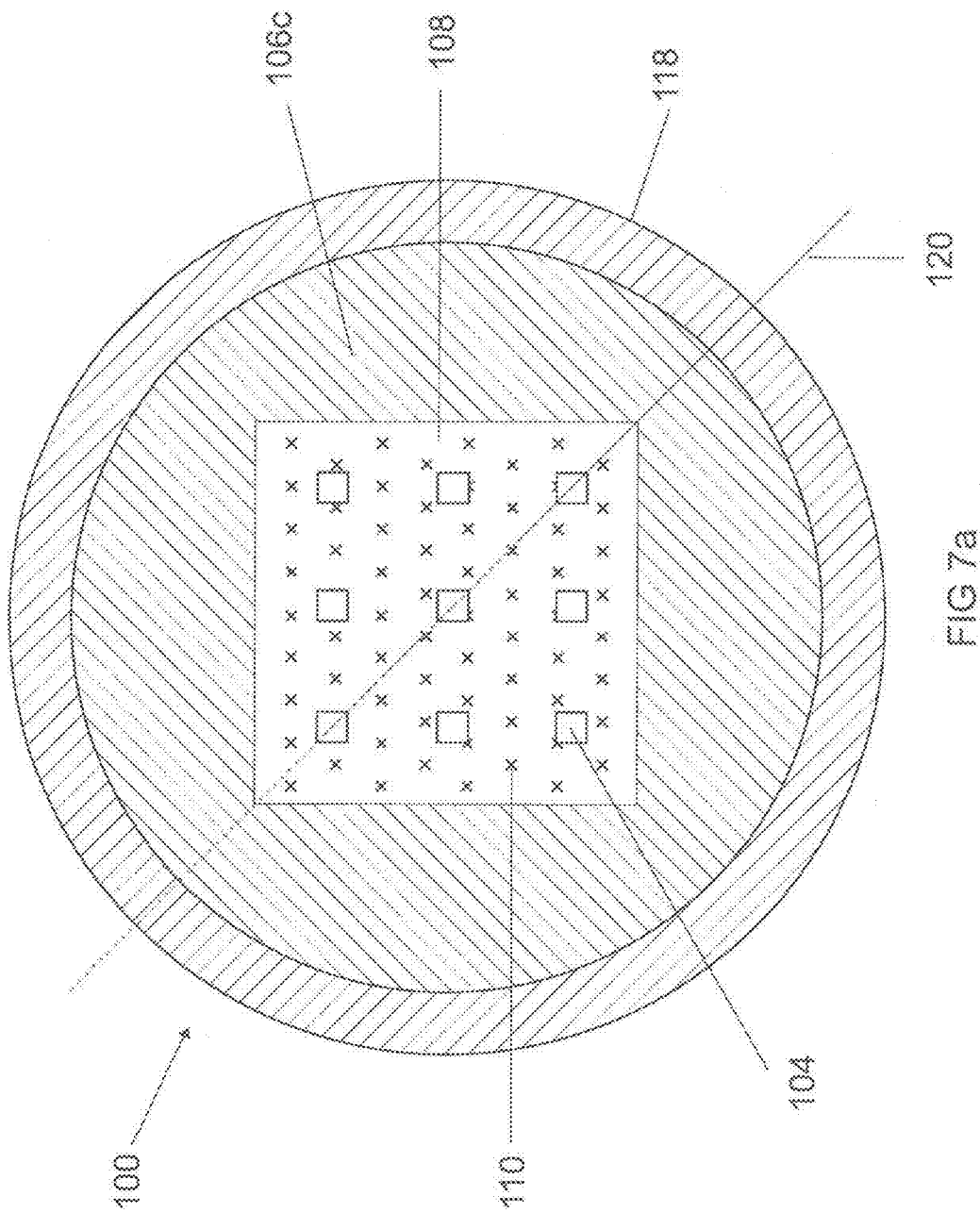

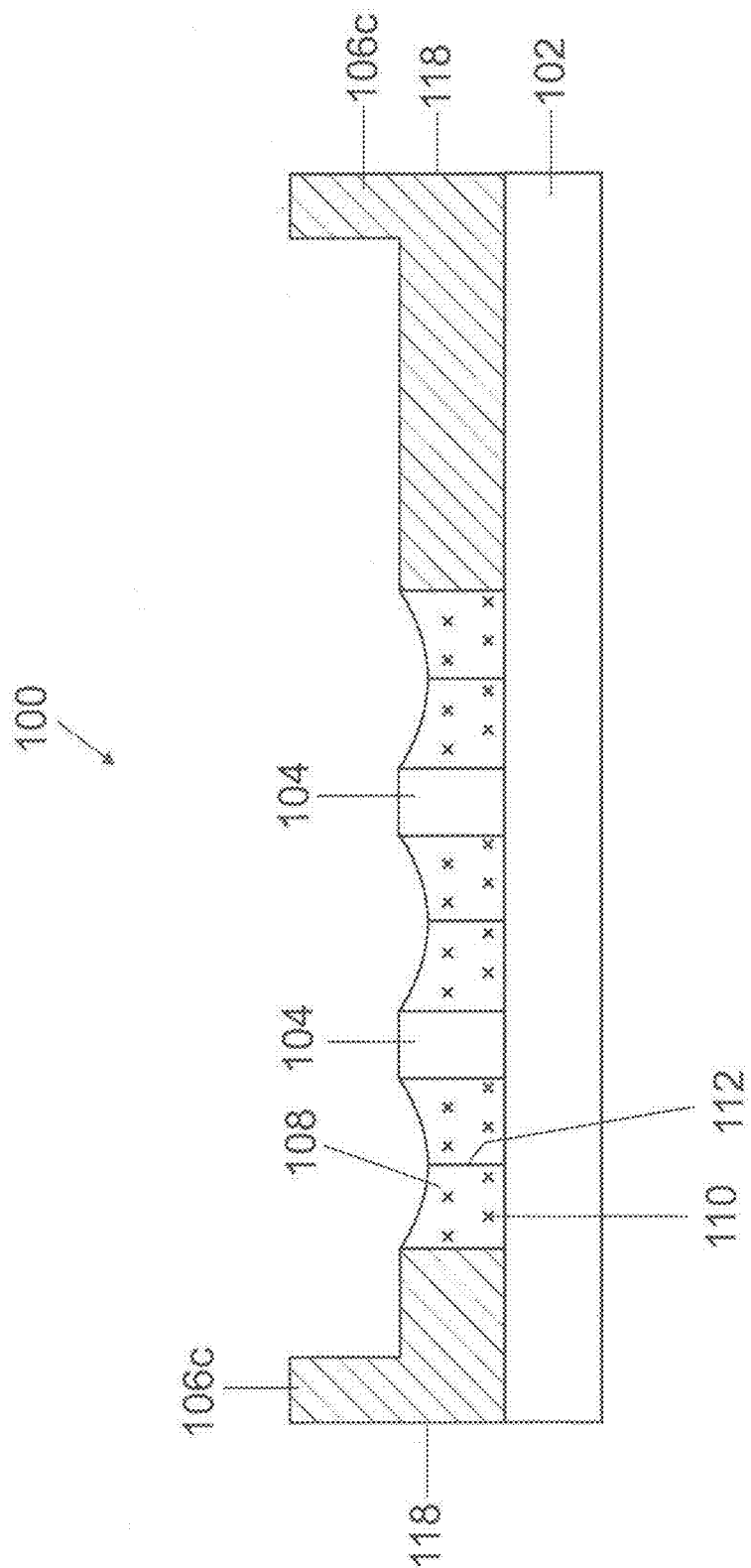

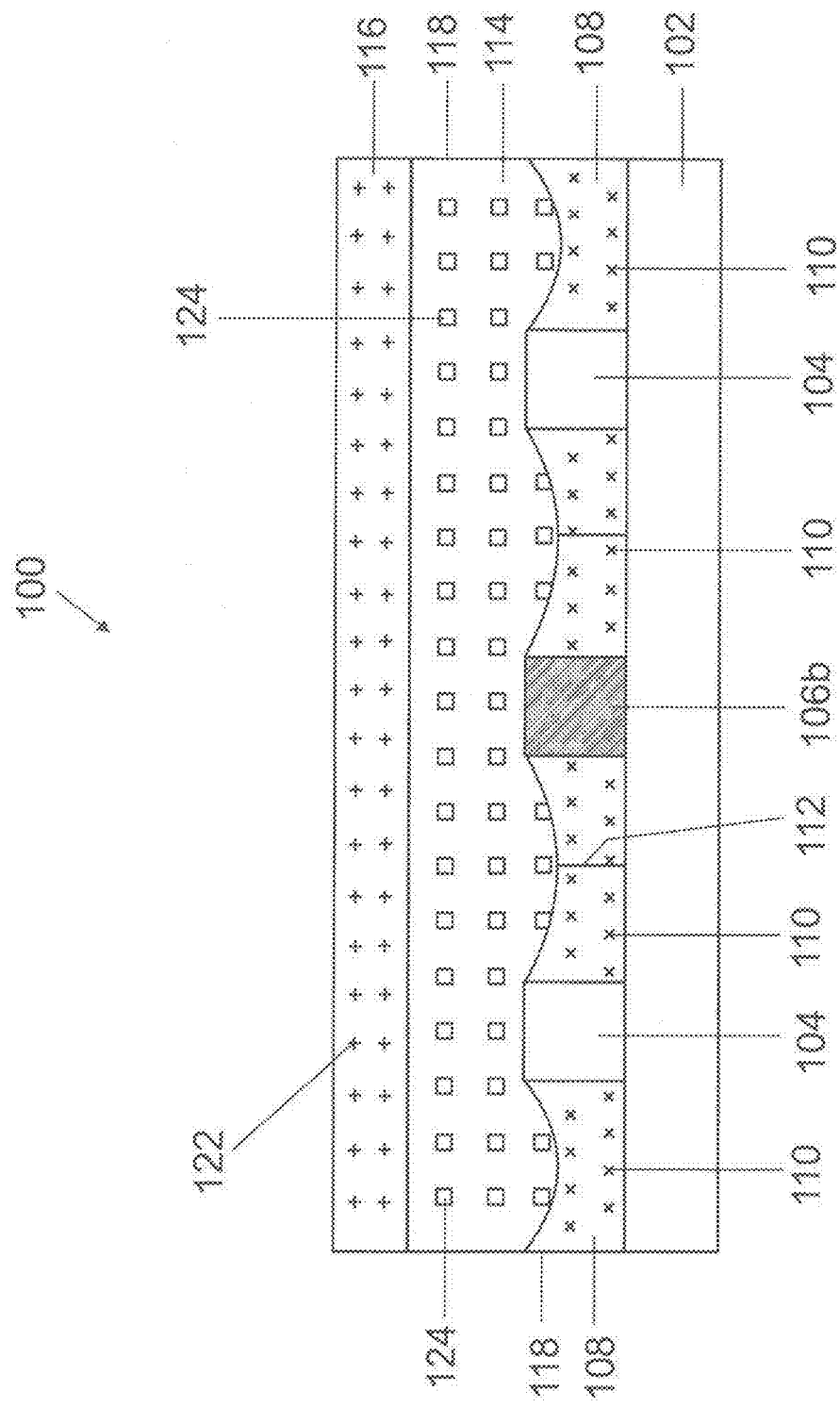

OPTOELECTRONIC COMPONENT AND METHOD FOR PRODUCING AN OPTOELECTRONIC COMPONENT

This patent application is a national phase filing under section 371 of PCT/EP2012/062465, filed Jun. 27, 2012, which claims the priority of German patent application 10 2011 079 403.4, filed Jul. 19, 2011, each of which is incorporated herein by reference in its entirety.

TECHNICAL FIELD

The present invention relates to an optoelectronic component, and to a method for producing such a component.

BACKGROUND

Optoelectronic components comprise a semiconductor chip that can emit electromagnetic radiation. The semiconductor chip can be arranged on a light-absorbing substrate. In order to improve or vary the reflective properties of the substrate, the exposed regions of the substrate can be covered with a medium into which pigments are introduced. The semiconductor chip is wettable by the medium comprising pigments. In particular, the side areas of the semiconductor chip are wettable. During wetting, the side areas of the semiconductor chip raise the medium on account of the surface tension. This can lead to a non-uniform layer thickness of the medium above the substrate, wherein the thickness of the medium decreases with increasing distance from the semiconductor chip. A small thickness of the medium can be disadvantageous since the reflective properties and, consequently, the efficiency of the optoelectronic component deteriorate as the thickness of the pigment-filled medium decreases.

SUMMARY OF THE INVENTION

Embodiments of the invention specify an optoelectronic component and a method for producing such a component which provide the pigment-filled medium with a sufficient thickness above the substrate, such that the reflective properties and, consequently, the efficiency of the optoelectronic component are of a sufficient quality.

Developments and advantageous configurations of the optoelectronic component and of the method for producing the optoelectronic component are specified in the dependent claims.

Various embodiments comprise an optoelectronic component comprising a semiconductor chip arranged on a substrate. A wettable attractor element is arranged on the substrate. A medium comprising pigments at least regionally covers the exposed region of the substrate that is not covered by the semiconductor chip nor by the attractor element. The medium at least partly wets the semiconductor chip and the attractor element. The thickness of the medium above the substrate is increased by the use of the attractor element. As a result, the reflective properties of the optoelectronic component are improved compared with embodiments without an attractor element. Consequently, the efficiency of the optoelectronic component is increased. In other words, the adverse influence of the substrate on the optical properties of the optoelectronic component is reduced.

A ceramic substrate, a metal-core circuit board, a leadframe or a plastic laminate can be used as the substrate. The plastic laminate consists of glass-fiber-reinforced plastic with a metallization. All the above types of substrate at least partly absorb light.

The semiconductor chip, like the attractor element, is wettable by the medium comprising pigments. As a result of the surface tension of the liquid medium, the medium is raised at the side areas of the semiconductor chip. In this case, the light-emitting surface of the semiconductor chip facing away from the substrate must not be wetted by the medium.

In one preferred embodiment, the semiconductor chip is based on a III-V compound semiconductor material, in particular on gallium nitride (GaN). The semiconductor chip has at least one active zone that emits electromagnetic radiation. The active zones can be pn junctions, a double heterostructure, multiquantum well structure (MQW), single quantum well structure (SQW). Quantum well structure means: quantum wells (3-dim), quantum wires (2-dim) and quantum dots (1-dim).

In one preferred embodiment, the semiconductor chip can be embodied as a surface emitter, in particular as a so-called thin-film chip. The thin-film chip is known from International Patent Publication No. WO 2005/081319 A1, for example.

In one preferred embodiment, the medium comprises silicone. Silicone has a low surfaced tension. Therefore, silicone has a good wettability. Silicone is transparent, radiation-stable and temperature-stable. Particularly preferably, the connecting material comprises soft silicone. Soft silicone has a hardness of approximately Shore 20 to approximately Shore 60. Soft silicone has a high temperature stability, a high radiation stability and a high elongation at break, as a result of which the risk of cracking in the silicone is minimized.

Alternatively or additionally, the medium can also comprise epoxy resin or hybrid materials.

In one preferred embodiment, the pigment-filled medium can have a minimum thickness above the substrate of at least 10% of the smaller height of attractor element and of semiconductor chip above the substrate. This is advantageous since the reflectivity of the pigment-filled medium is sufficiently high as a result. In other words, the adverse influence of the substrate on the reflectivity of the optoelectronic component is negligible.

In one preferred embodiment, only the side areas of the attractor element are wetted by the medium. The liquid medium rises on account of the surface tension at the side areas of the attractor element. As a result, the liquid film, more precisely the surface of the liquid, is raised. This is advantageous since, as a result, the height of the medium above the substrate is increased in the vicinity of the attractor element. The top face of the attractor element is not covered by the medium. In other words, no over-potting is effected. A slight under-potting of the medium between the semiconductor chip and the attractor element is advantageous. In the case of a slight under-potting, the potted medium has the form of a meniscus.

In an alternative preferred embodiment, the attractor element can be completely covered by the medium. In this case, the attractive effect of the side areas of the attractor element on the liquid medium is admittedly lower than in the previous embodiment. Moreover, there is the risk of the light-emitting surface of the semiconductor chip being at least partly covered by the medium. However, the complete covering of the attractor element by the medium can afford process engineering advantages.

As a result of an approximately homogeneous layer thickness of the medium comprising pigments, the homogeneity of the color impression can be increased. The layer thickness determines the proportion of the light reflected by the pigments with respect to the proportion of the light reflected by the substrate.

In order to further increase the reflectivity of the optoelectronic component, the substrate can be coated with a noble metal, such as gold or silver. Silver coatings are particularly advantageous since silver has a high reflectivity for electromagnetic radiation in the entire visible spectral range. The coating of the substrate with a noble metal can be effected in addition to increasing the layer thickness of the pigment-filled medium.

In one preferred embodiment, the attractor element has a height above the substrate of 10% to 300%, preferably of 80% to 120%, of the height of the semiconductor chip. The height of the optoelectronic semiconductor chip can be between approximately 40 μm and approximately 1000 μm, preferably between 80 μm and 200 μm. This height range for the wettable attractor element is particularly advantageous since, as a result, firstly a sufficient height of the medium is achieved and secondly the structural height of the optoelectronic component is not adversely influenced.

In one preferred embodiment, the optoelectronic component comprises at least one further semiconductor chip. Such multi-chip arrangements are particularly advantageous since they have a high light power.

In one preferred embodiment, the optoelectronic component comprises at least one further attractor element. A plurality of attractor elements can be advantageous since, as a result, it is possible to comply with a required minimum thickness of the medium even between semiconductor chips that are relatively far away from one another. It is particularly advantageous to comply with approximately uniform distances between all elements, that is to say between adjacent semiconductor chips, adjacent attractor elements and between adjacent semiconductor chips and attractor elements. By way of example, an attractor element should be at a distance from the closest semiconductor chip of between 2/3 and 3/2 of the distance between two adjacent semiconductor chips.

In one preferred embodiment, the at least one attractor element can be arranged around the at least one semiconductor chip. As a result, arbitrarily shaped chip arrangements can be adapted to arbitrarily shaped boundaries of optoelectronic components.

In one preferred embodiment, the attractor element has a bonding wire. The bonding wire can comprise gold. The majority of the bonding wire is wetted by the medium comprising pigments. Only the tip of the bonding wire projects from the surface of the liquid. This is particularly advantageous since only a minimal proportion of the reflectivity of the reflective medium is lost. Moreover, the bonding wire can be fixed on the substrate in a particularly simple manner by welding.

In an alternative preferred embodiment, the entire bonding wire including the tip is covered by the medium. This is particularly advantageous since, as a result, the reflectivity is increased again in comparison with the pervious embodiment.

In one preferred embodiment, the attractor element comprises a blocky element, in particular composed of silicon, gallium arsenide, germanium, plastic, glass, sapphire or metal, such as copper or gold. The blocky element can have the shape of a rectangular parallelepiped. The blocky element is particularly advantageous since a high layer thickness of the pigment-filled medium and thus a high reflectivity of the layer can be achieved as a result. Moreover, the blocky element can be fixed on the substrate in a particularly simple manner by adhesive bonding or soldering. The blocky element is preferably fixed on the substrate by the same method as the semiconductor chips. This ensures a particularly simple production of the optoelectronic component.

In one preferred embodiment, the attractor element has a delimiting element. The delimiting element can comprise polybutylene terephthalate (PBT). Polybutylene terephthalate can be white or colored. It is wettable by a medium such as silicone, and electrically insulating, has a high reflectivity for electromagnetic radiation in the entire visible spectral range and is heat-resistant. The delimiting element can be arranged around the at least one semiconductor chip. The delimiting element is particularly advantageous since, as a result, arrangements of semiconductor chips can be adapted to different boundaries of the optoelectronic component.

In one preferred embodiment, the attractor element has a delimiting element having an inner structure. The delimiting element and the inner structure are embodied in one-piece. The combination of delimiting element and inner structure in an attractor element is particularly advantageous since an arrangement of semiconductor chips can be adapted to arbitrary boundaries of the optoelectronic component and, at the same time, an attractor structure can be positioned between the semiconductor chips. The attractor element can be applied in a single process step.

The combination of delimiting element and inner structure, which is embodied in one-piece, comprises polybutylene terephthalate (PBT).

In one preferred embodiment, the inner structure of the attractor element has the form of a grid. This regular structure is particularly advantageous since the distances between the semiconductor chips and the attractor element are approximately uniform.

In one preferred embodiment, the medium comprises white pigments. The white pigments serve for reflecting electromagnetic radiation from the entire visible spectral range. In other words, white pigments are highly reflective in a broadband manner. The aim is to reflect as much white light as possible. Pigments composed of titanium dioxide ($TiO_2$) and/or composed of aluminum oxide ($Al_2O_3$) and/or composed of zirconium oxide (ZrO) can be used as white pigments. The dependence of the reflectivity of the pigment-filled medium on the layer thickness of the pigment-filled medium is not linear. In the case of layer thicknesses of between approximately 1 μm and 20 μm, the reflectivity rises greatly. In the case of layer thicknesses of between 50 μm and 100 μm, the reflectivity increases only to an insignificant extent. Preferably, the minimum layer thickness should be at least approximately 20 μm. For a 200 μm thick semiconductor chip, this would be 10% of the height of the semiconductor chip.

In one preferred embodiment, the medium comprises black pigments. The black pigments can be carbon black particles or graphite particles. The reflectivity of the medium can fall to vanishing values. This is particularly advantageous since a high contrast between the semiconductor chip and the substrate area surrounding the semiconductor chip can be achieved as a result. A large thickness of the medium filled with black pigments between and around the semiconductor chips and between and around the attractor elements reinforces the black impression.

In one preferred embodiment, the medium comprises chromatic pigments. The chromatic pigments can comprise reddish iron oxide pigments. As a result of the use of chromatic pigments, only specific wavelengths of visible light are reflected. If white light is incident on the medium filled with red pigments, predominantly red light is reflected. What is particularly advantageous about a sufficiently thick medium comprising chromatic pigments is that a high color homogeneity can be achieved.

In one preferred embodiment, the pigments are present in a concentration of up to 70%, preferably of 25% to 35%, percent by weight in the medium. The higher the concentration of white pigments, the higher the reflectivity of the medium for white light. The higher the concentration of chromatic pigments, the more intensive the color impression of the medium.

In one preferred embodiment, a layer comprising luminophore particles is applied on that area of the semiconductor chip which faces away from the substrate, on that area of the attractor element which faces away from the substrate, and on the medium. The layer comprising luminophore particles can comprise silicone as matrix material. The luminophore particles can comprise phosphors. As phosphors lanthanum-doped yttrium oxide ($Y_2O_3$—$La_2O_3$), yttrium aluminum garnet ($Y_3Al_5O_{12}$—YAG), dysprosium oxide ($Dy_2O_3$), aluminum oxynitride ($Al_{23}O_{27}N_5$) or aluminum nitride (AlN) can be present in a concentration of approximately 5 to approximately 15 percent by weight. Yttrium aluminum garnet, for example, converts blue light into longer-wave light from the yellow-green spectral range.

In one preferred embodiment, a layer comprising diffuser particles is applied on that area of the semiconductor chip which faces away from the substrate, on that area of the attractor element which faces away from the substrate, and on the medium. The diffuser particles scatter light without influencing its wavelength and provide for the mixing of the light. The diffuser particles can comprise aluminum oxide ($Al_2O_3$).

Diffuser particles and luminophore particles interact with the light emitted by the semiconductor chip and backscatter part of said light into the medium filled with pigments. In the case of a medium comprising white pigments, the backscattered light is reflected by the white pigments and can be at least partly coupled out from the optoelectronic component.

In one preferred embodiment, a layer comprising luminophore particles is applied on that area of the semiconductor chip which faces away from the substrate, on that area of the attractor element which faces away from the substrate, and on the medium. A layer comprising diffuser particles is applied on the layer comprising luminophore particles.

In one preferred embodiment, a layer comprising both luminophore particles and diffuser particles is applied on that area of the semiconductor chip which faces away from the substrate, on that area of the attractor element which faces away from the substrate, and on the medium.

In an alternative preferred embodiment, a converter lamina is applied on the light-emitting surface of the semiconductor chip facing away from the substrate. The converter lamina can consist of a ceramic matrix material into which luminophore particles are introduced. A layer comprising diffuser particles can be applied to the converter lamina, to that area of the attractor element which faces away from the substrate, and to the medium.

Various embodiments comprise a method for producing an optoelectronic component. Firstly a substrate is provided, on which a semiconductor chip is arranged. Furthermore, a wettable attractor element is arranged on the substrate. Afterward, a liquid medium comprising pigments is at least regionally applied to the exposed region of the substrate that is not covered by the semiconductor chip and the attractor element. The liquid medium is subsequently cured.

In one preferred embodiment, the liquid medium is applied to the substrate by dispensing, in particular by jetting.

In one preferred embodiment, after the medium comprising pigments has been cured, a layer comprising diffuser particles is applied to that area of the semiconductor chip which faces away from the substrate, to that area of the attractor element which faces away from the substrate, and to the cured medium.

In an alternative preferred embodiment, after the medium comprising pigments has been cured, a layer comprising luminophore particles is applied to that area of the semiconductor chip which faces away from the substrate, to that area of the attractor element which faces away from the substrate, and to the cured medium.

In a further alternative preferred embodiment, after the medium comprising pigments has been cured, firstly a layer comprising luminophore particles is applied to that area of the semiconductor chip and of the attractor element which faces away from the substrate, and to the cured medium. A layer comprising diffuser particles is subsequently applied.

In a further alternative preferred embodiment, after the medium comprising pigments has been cured, a layer comprising both luminophore particles and diffuser particles is applied to areas of the semiconductor chip and areas of the attractor element which face away from the substrate, and to the cured medium.

In a further alternative preferred embodiment, after the medium comprising pigments has been cured, firstly a converter lamina is applied to the semiconductor chip. A layer comprising diffuser particles is subsequently applied to the converter lamina, to that area of the attractor element which faces away from the substrate, and to the cured medium.

BRIEF DESCRIPTION OF THE DRAWINGS

Various exemplary embodiments are explained in greater detail below with reference to the drawings. Elements that are identical, of identical type or act identically are provided with the same reference signs in the figures. The figures and the size relationships of the elements illustrated in the figures among one another should not be regarded as to scale. Rather, individual elements may be illustrated with an exaggerated size or reduced size in order to enable better illustration and in order to afford a better understanding.

FIG. 1a shows an exemplary embodiment of a known optoelectronic component in plan view;

FIG. 2a shows an exemplary embodiment of an optoelectronic component in plan view;

FIG. 2b shows the exemplary embodiment of the optoelectronic component from FIG. 2a in sectional view;

FIG. 3a shows an exemplary embodiment of an optoelectronic component in plan view;

FIG. 5a shows an exemplary embodiment of an optoelectronic component in plan view;

FIG. 6a shows an exemplary embodiment of an optoelectronic component in plan view;

FIG. 7a shows an exemplary embodiment of an optoelectronic component in plan view;

FIG. 8b shows the exemplary embodiment of the optoelectronic component from FIG. 8a in sectional view;

FIG. 10b shows the exemplary embodiment of an optoelectronic component in sectional view;

DETAILED DESCRIPTION OF ILLUSTRATIVE EMBODIMENTS

Figure 1B:
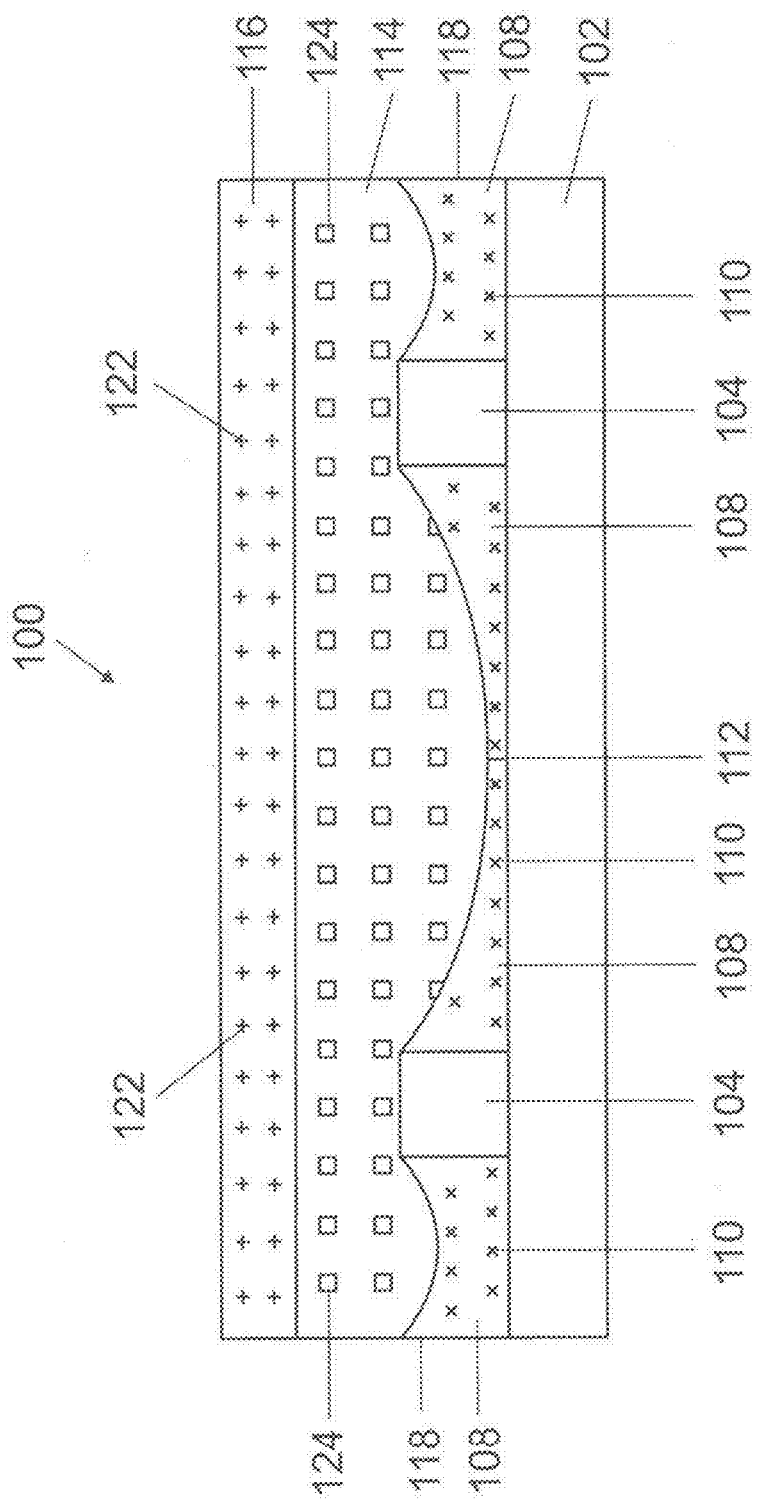
FIG. 1b shows the exemplary embodiment of the known optoelectronic component from FIG. 1a in sectional view.

FIG. 1a shows an exemplary embodiment of a known optoelectronic component 100 in plan view. Four semiconductor chips 104 are arranged regularly on a substrate, not visible in plan view. The exposed region of the substrate between and around the four semiconductor chips 104 is completely covered with a medium 108 comprising pigments 110. The medium 108 can comprise silicone. The pigments 110 can be white pigments composed of titanium dioxide. The optoelectronic component has a defined edge 118. Layers comprising luminophore particles and/or diffuser particles can be applied on the medium 108 comprising pigments 110. Said layers are not illustrated in FIG. 1a, for the sake of clarity. A sectional axis 120 is depicted, along which the sectional view of the optoelectronic component 100 is illustrated in FIG. 1b.

FIG. 1b shows the exemplary embodiment of the known optoelectronic component from FIG. 1a in sectional view. Two semiconductor chips 104 arranged on a substrate 102 can be discerned in the sectional view. The substrate 102 can comprise ceramic. The ceramic substrate 102 absorbs electromagnetic radiation in the visible spectral range. In order to vary the reflective properties of the substrate 102, a medium 108 containing pigments 110 is applied on the substrate 102. The pigments 110 can be white pigments. The medium 108 comprising pigments 110 completely wets the side areas of the semiconductor chips 104; between the semiconductor chips 104 and between the semiconductor chips 104 and the edge 118, the medium 108 is arranged in the form of an under-potting in meniscus form. The distance between the semiconductor chips 104 has a magnitude such that the medium 108 at its thinnest location 112, in the center between the two semiconductor chips 104, has a height above the substrate 102 of less than 10% of the height of the semiconductor chips 104. This has the consequence that the ceramic substrate 102 shows through the medium between the semiconductor chips. In other words, the reflectivity of the medium 108 is reduced. Electromagnetic radiation from the visible spectral range that impinges on the medium 108 is absorbed by the substrate to an increased extent and therefore can no longer be coupled out from the optoelectronic component. The efficiency of the optoelectronic component decreases. Said impinging radiation is backscattered light from layers 114, 116 applied on the pigment-filled medium 108. A layer 114 comprising luminophore particles 124 is applied directly on the pigment-filled medium 108. Luminophores used include phosphors such as yttrium aluminum garnet (YAG) which convert the blue primary radiation emitted by the semiconductor chips 104 into longer-wave yellow-green secondary radiation. A layer 116 comprising diffuser particles 122 is applied on the layer 114 comprising luminophore particles 124. Diffuser particles 122 used include aluminum oxide ($Al_2O_3$). The diffuser particles interact with the blue primary radiation and the yellow secondary radiation without altering the wavelength thereof. The layer 116 comprising diffuser particles 122 serves for mixing primary radiation and secondary radiation. The luminophore particles 124 and the diffuser particles 122 emit light in all spatial directions. Therefore, part of the blue primary radiation and part of the yellow secondary radiation impinge on the medium 108 filled with pigments 110. Since the potted medium 108 comprising pigments 110 is very thin between the semiconductor chips 104, part of the backscattered primary and secondary radiation passes through the medium without being reflected by a white pigment 110. This proportion can be absorbed by the substrate 102.

For the sake of clarity, FIGS. 2a, 2b, 3a, 3b, 3c, 3d, 4a, 4b, 5a, 5b, 6a, 6b, 7a, 7c, 8a, 8b, 9a and 9b do not illustrate layers 114, 116 comprising luminophore particles 124 or diffuser particles 122. The interaction of layers 114, 115, 116 comprising luminophore particles 124 and/or diffuser particles 122 with the medium 108 comprising pigments 110 is illustrated in FIGS. 10a, 10b, 10c and 10d.

FIG. 2a shows an exemplary embodiment of an optoelectronic component in plan view. The optoelectronic component has a square or at least a rectangular shape having a linear boundary 118. Four semiconductor chips 104 are arranged regularly on a substrate, not visible in plan view. Moreover, a wettable attractor element 106a is arranged centrally on the substrate. The attractor element 106a is therefore arranged between the semiconductor chips 104. The attractor element is at approximately the same distance from each of the four semiconductor chips 104. The attractor element (106a) is a bonding wire. The bonding wire is composed of gold.

The optoelectronic component has a defined edge 118. The exposed region of the substrate between and around the four semiconductor chips 104 is completely covered with a medium 108 comprising pigments 110. The medium 108 can comprise silicone. Alternatively or additionally, the medium 108 can comprise epoxy resin or a hybrid material. The pigments 110 can be white pigments. The white pigments can comprise titanium dioxide ($TiO_2$) and/or aluminum oxide ($Al_2O_3$) and/or zirconium oxide (ZrO). Alternatively, the pigments 110 can be black pigments, in particular carbon black particles or graphite particles. Alternatively, the pigments 110 can be chromatic pigments, in particular iron oxide pigments.

FIG. 2b shows the exemplary embodiment of the optoelectronic component from FIG. 2a in sectional view along a sectional axis 120. Between the two semiconductor chips 104, the bonding wire as the wettable attractor element 106 is arranged on the substrate 102. The substrate 102 can be a ceramic substrate, a metal-core circuit board, a leadframe or a plastic laminate. The medium 108 comprising pigments 110 almost completely wets the bonding wire 106a. Only the tip of the bonding wire 106a projects slightly from the medium 108. Therefore, the influence of the bonding wire 106a on the reflective properties of the medium 108 is minimal. The medium 108 comprising pigments 110 has a minimum thickness 112 above the substrate 102 of at least 10% of the smaller height of attractor element 106a and of semiconductor chip 104 above the substrate 102. In FIG. 2b, the bonding wire 106a has approximately the same height as the adjacent semiconductor chips 104. In the present FIG. 2b, the minimum thickness 112 is approximately 60% of the height of the adjacent semiconductor chips 104. This large thickness of the medium 108 ensures that the reflective properties of the optoelectronic component cannot be influenced or can scarcely be influenced by the underlying substrate 102. In the case of white pigments 110, a large part of the electromagnetic radiation incident on the medium is reflected. The losses as a result of absorption of the electromagnetic radiation by the substrate are minimized. The pigments 110 are present in a concentration of up to 70%, preferably of 25% to 35%, percent by weight in the medium 108. The minimum thickness 112 of the medium 108 comprising pigments 110 is of approximately the same magnitude between the bonding wire 106a and the semiconductor chips 104 and between the semiconductor chips 104 and the edge 118 of the optoelectronic component. This ensures that the entire area of the optoelectronic component has an approximately uniform reflectivity. In the case of white pigments, this leads to a location-independent, homogeneous brightness of the optoelectronic component.

FIG. 3a shows an exemplary embodiment of an optoelectronic component in plan view. The attractor element 106b is a blocky element. The blocky attractor element 106b can comprise silicon, gallium arsenide, germanium, plastic, glass, sapphire or metal, such as copper or gold. The attractor element 106b is arranged centrally between the four semiconductor chips 104.

Figure 3B:
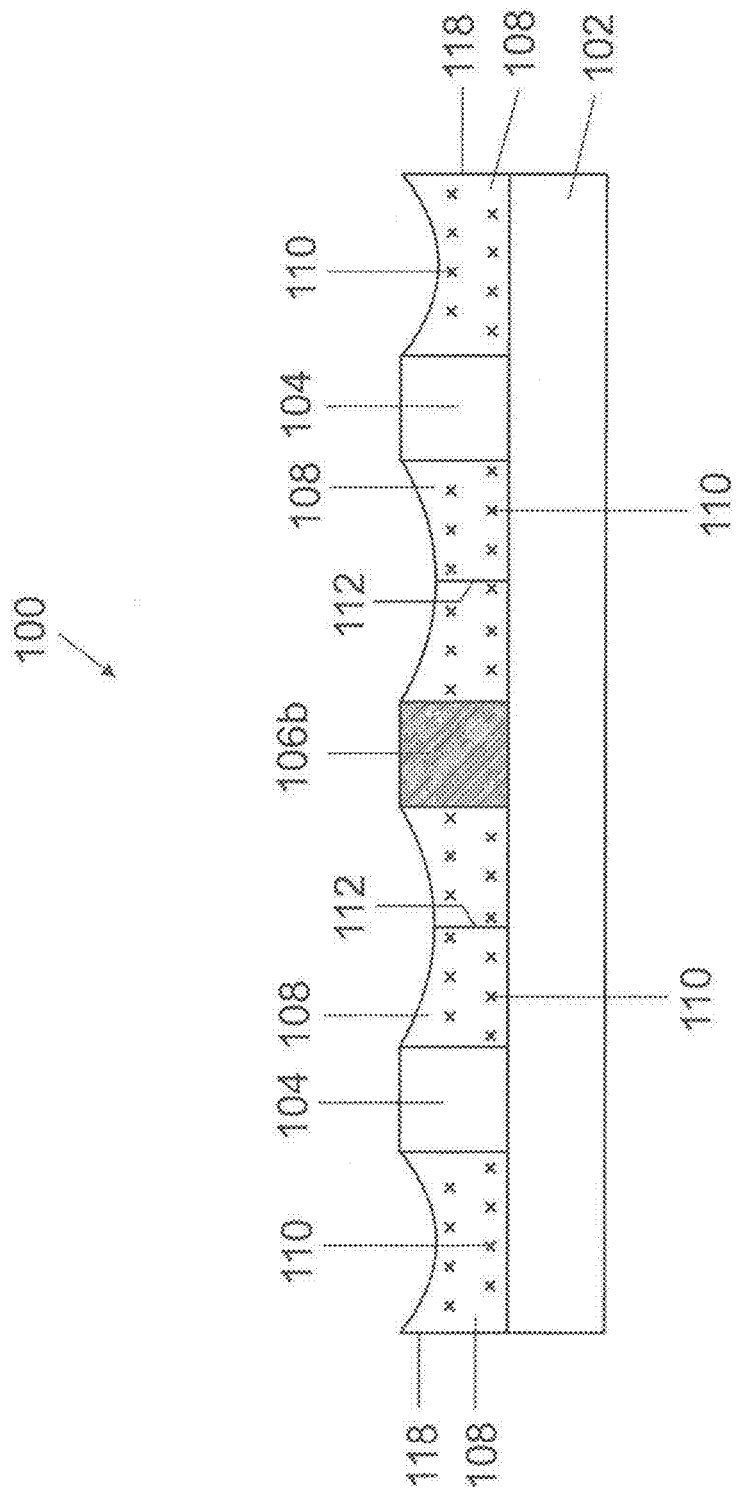
FIGS. 3b, 3c and 3d show exemplary embodiments of the optoelectronic component from FIG. 3a in sectional view.

FIG. 3b shows the exemplary embodiment of the optoelectronic component from FIG. 3a in sectional view. The blocky element 106b has the same height above the substrate 102 as the semiconductor chips 104. The minimum thickness 112 is approximately 60% of the height of the blocky element 106b or of the height of the semiconductor chips 104. The side areas of the blocky attractor element 106b are completely wetted by the medium 108. For the rest, the exemplary embodiment corresponds to the exemplary embodiment illustrated in FIG. 2b.

Figure 3C:
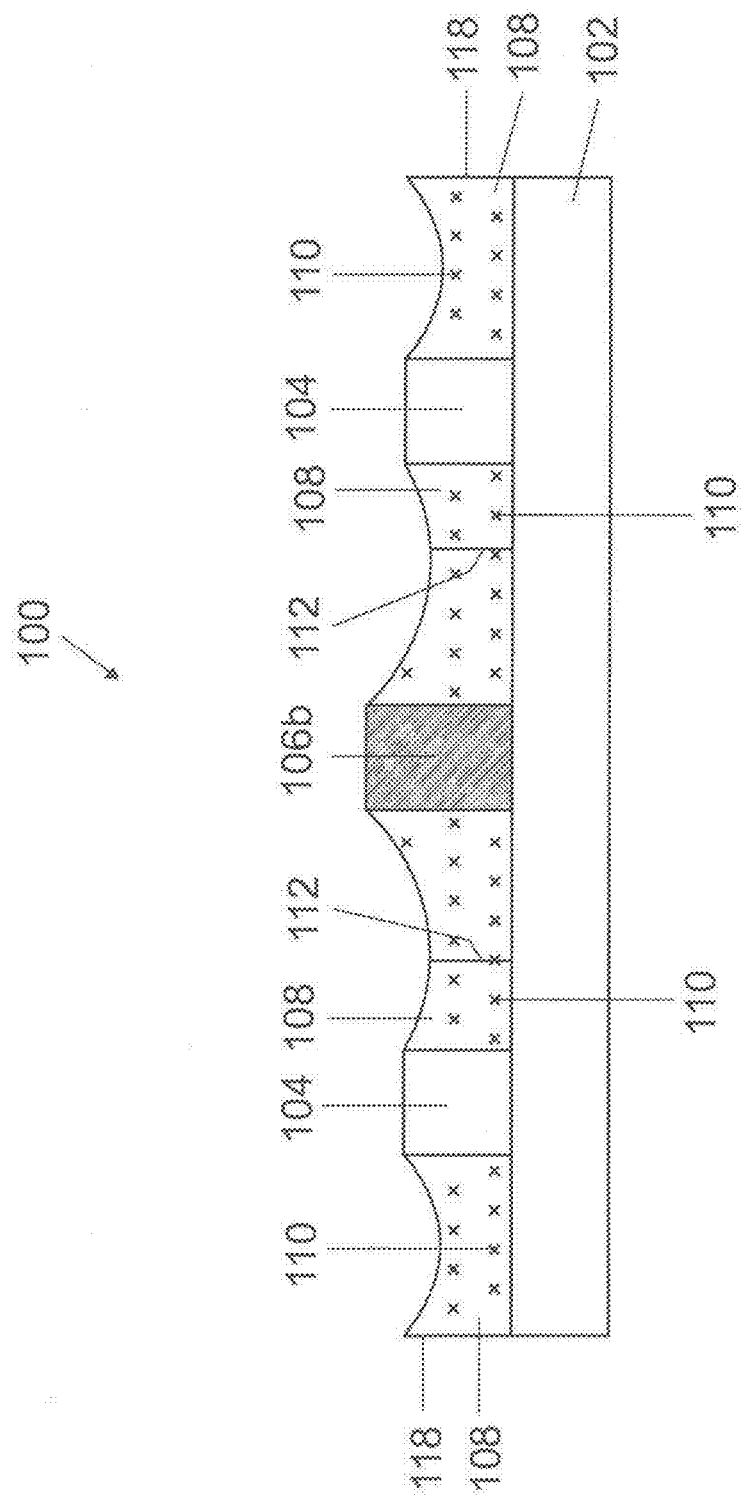

FIG. 3c shows a further exemplary embodiment of the optoelectronic component from FIG. 3a in sectional view. The attractor element 106b has a height above the substrate 102 of approximately 130% of the height of the semiconductor chip 104. The minimum thickness 112 of the medium 108 filled with pigments 110 is greater than the minimum thickness 112 in the exemplary embodiment shown in FIG. 3b. As a result of the larger thickness of the medium 108 filled with pigments 110, the influence of the substrate on the reflective properties of the optoelectronic component is further reduced compared with the exemplary embodiment from FIG. 3b. In the case of white pigments 110, the electromagnetic radiation incident on the medium 108 is almost completely reflected. The losses as a result of absorption of the radiation by the substrate 102 are minimized.

Figure 3D:
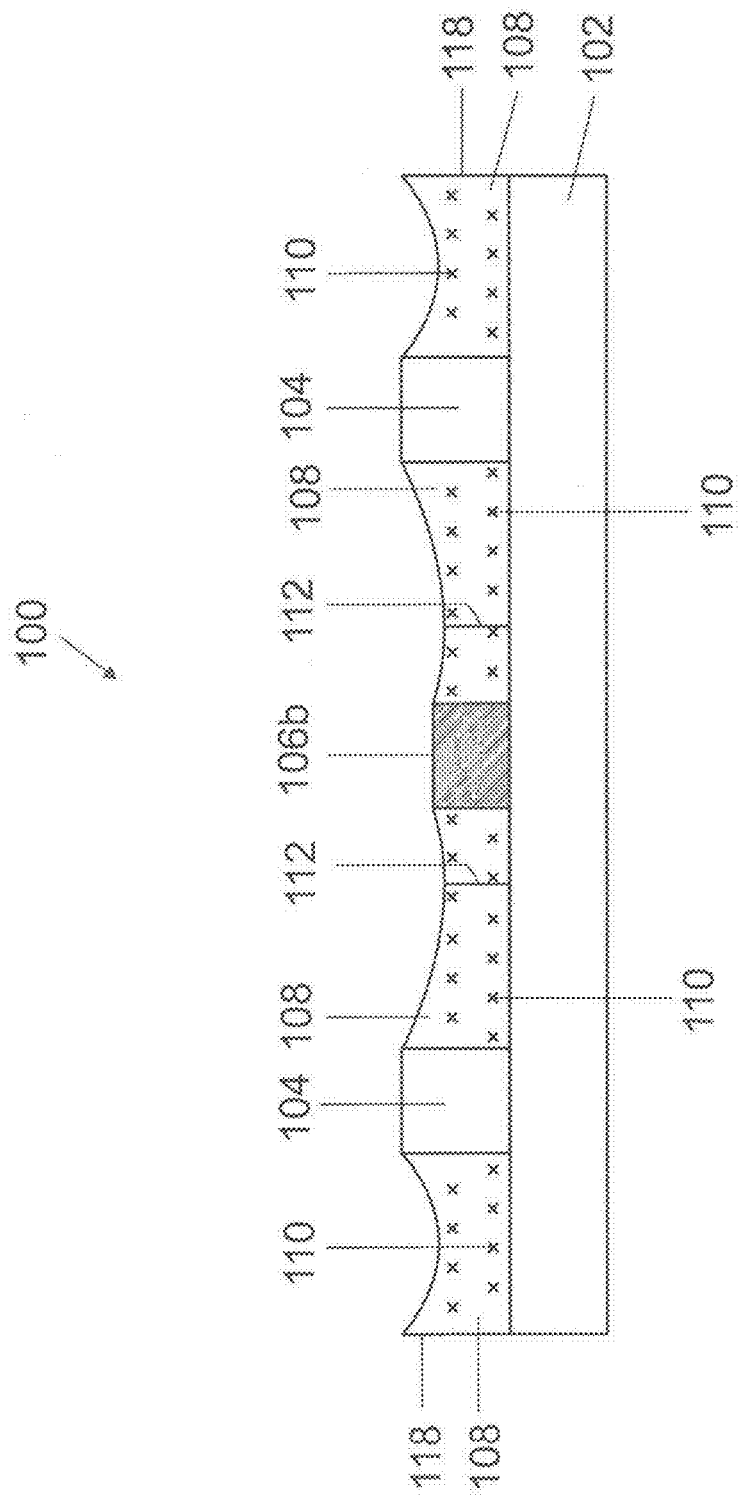

FIG. 3d shows a further exemplary embodiment of the optoelectronic component from FIG. 3a in sectional view. The attractor element 106b has a height above the substrate 102 of approximately 60% of the height of the semiconductor chip 104. The minimum thickness 112 of the medium 108 filled with pigments 110 is less than the minimum thickness 112 in the exemplary embodiments shown in FIGS. 3b and 3c. However, the thickness of the medium 108 suffices to ensure that the reflective properties of the optoelectronic component are influenced by the substrate 102 only to a small extent.

In exemplary embodiments that are not shown, the height of the attractor element can comprise between 10% and 300%, preferably 80% and 120%, of the height of the semiconductor chip 104.

Figure 4A:
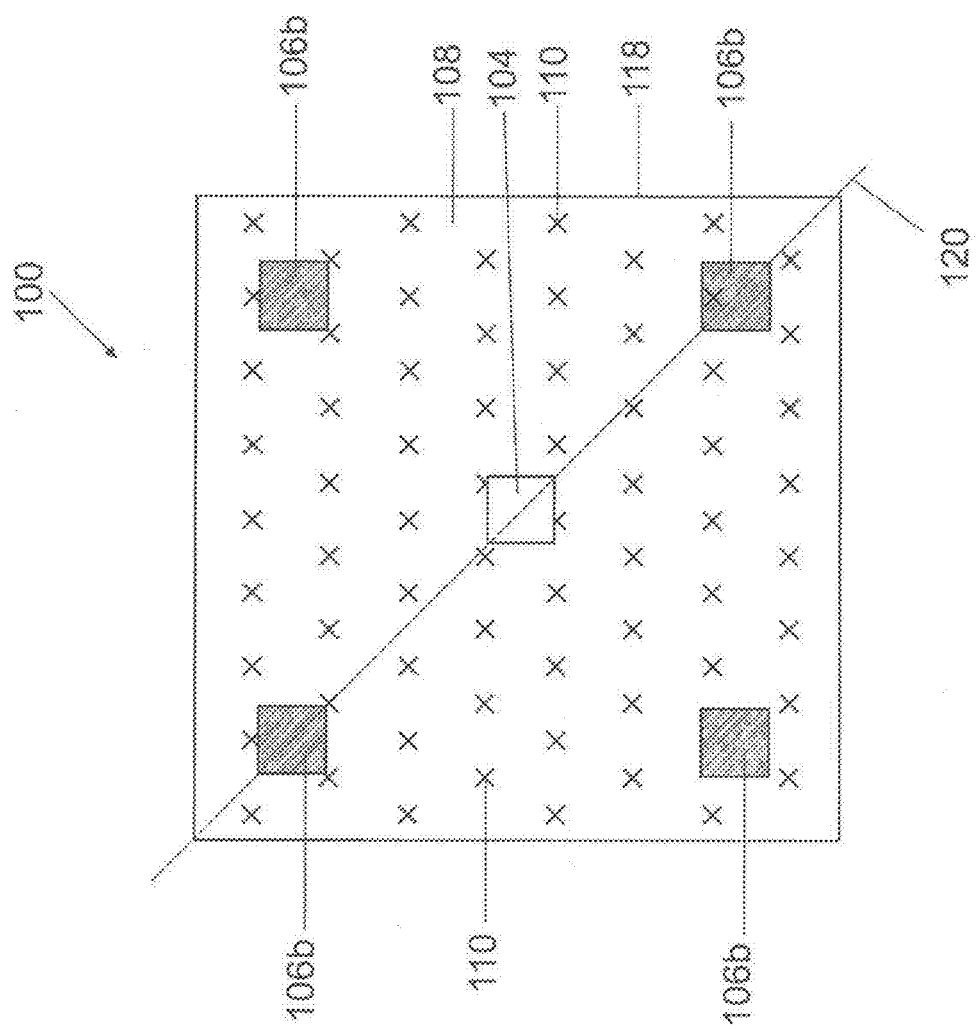
FIG. 4a shows an exemplary embodiment of an optoelectronic component in plan view.

FIG. 4a shows an exemplary embodiment of an optoelectronic component in plan view. The light-emitting semiconductor chip 104 is arranged centrally on the substrate of the optoelectronic component. Four blocky attractor elements 106b are arranged at regular distances around the semiconductor chip. For the rest, the exemplary embodiment corresponds to the exemplary embodiment shown in FIG. 3a.

Figure 4B:
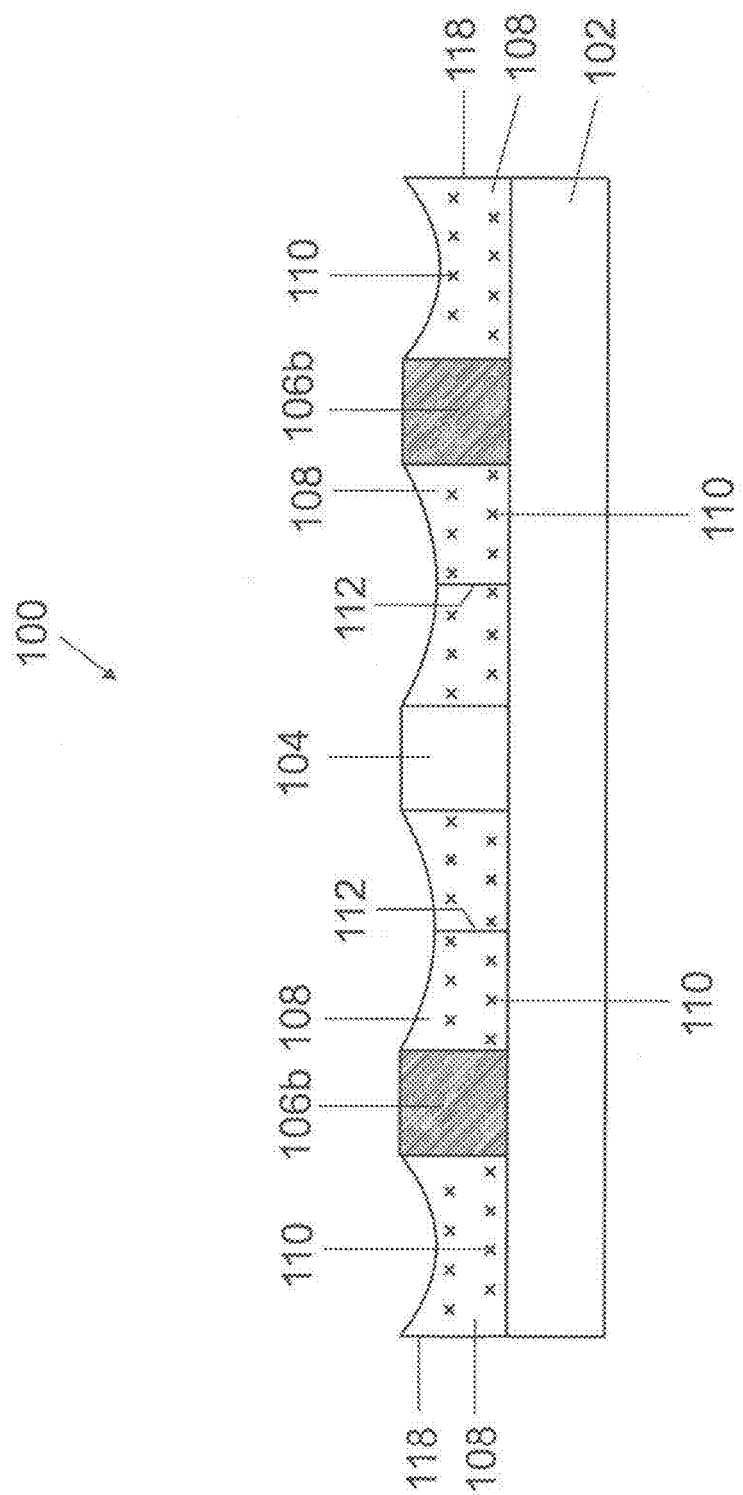
FIG. 4b shows the exemplary embodiment of the optoelectronic component from FIG. 4a in sectional view.

FIG. 4b shows the exemplary embodiment of the optoelectronic component from FIG. 4a in sectional view. The semiconductor chip 104 is arranged centrally between the blocky attractor elements 106b on the substrate 102. For the rest, the exemplary embodiment corresponds to the exemplary embodiment shown in FIG. 3b.

FIG. 5a shows an exemplary embodiment of an optoelectronic component in plan view. The semiconductor chips are arranged on the substrate in each case in the vicinity of the corners of the optoelectronic component. A multiplicity of attractor elements 106a are arranged in a regular manner on the substrate between the semiconductor chips 104. This results in an array of bonding wires 106a. For the rest, the exemplary embodiment corresponds to the exemplary embodiment shown in FIG. 2a.

Figure 5B:
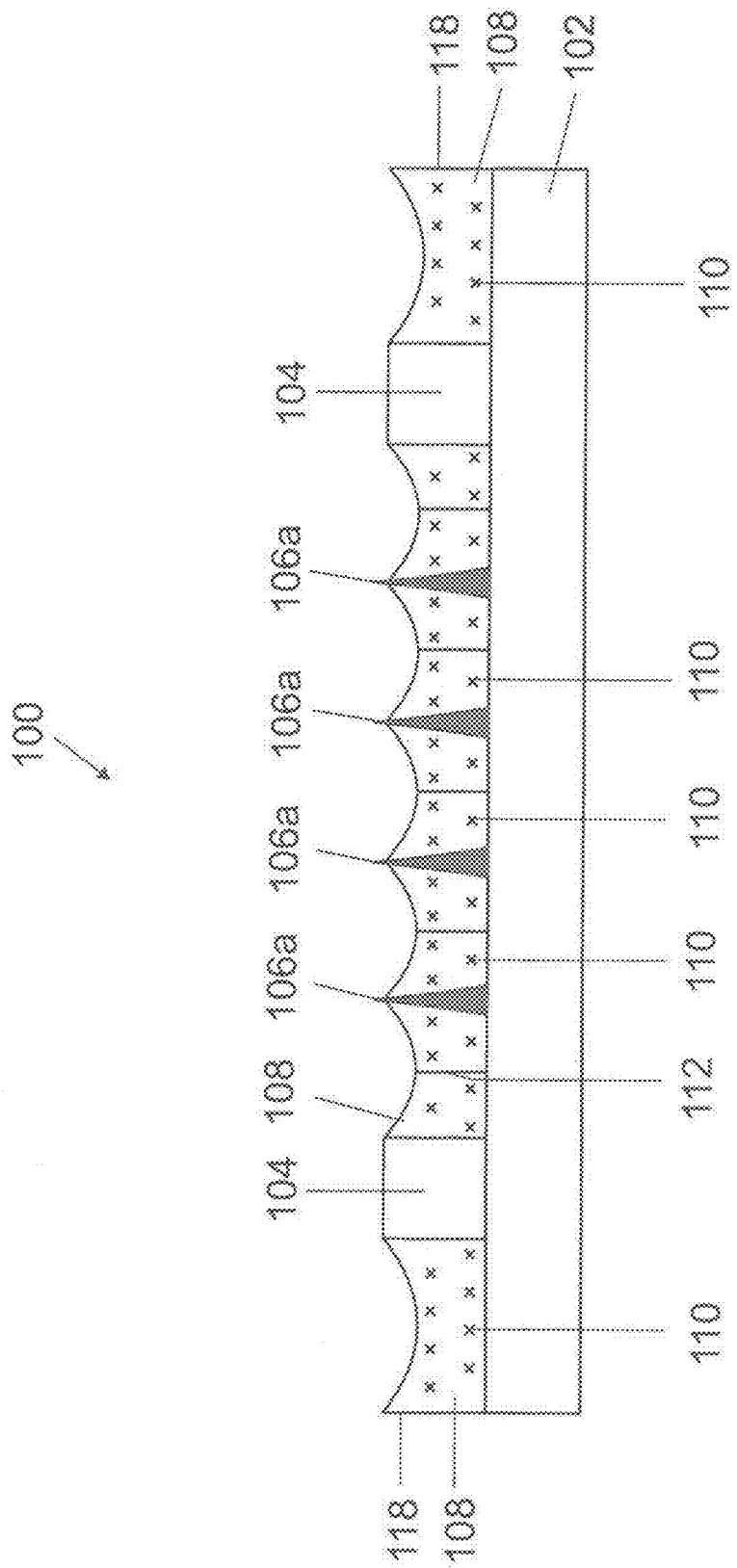
FIG. 5b shows the exemplary embodiment of the optoelectronic component from FIG. 5a in sectional view.

FIG. 5b shows the exemplary embodiment of the optoelectronic component from FIG. 5a in sectional view. Along the sectional axis 120, four bonding wires 106a are arranged approximately equidistantly between two semiconductor chips 104. The minimum thickness 112 of the medium 108 is approximately 60% of the height of the closest semiconductor chip 104 or of the closest bonding wire 106a. For the rest, the exemplary embodiment corresponds to the exemplary embodiment shown in FIG. 2b.

FIG. 6a shows an exemplary embodiment of an optoelectronic component in plan view. The boundary 118 of the optoelectronic component is round. In the center, a multiplicity of semiconductor chips 104 are arranged in a rectangular shape. Around the semiconductor chips 104, an array of bonding wires 106a are arranged at regular distances from one another and from the semiconductor chips 104. The exemplary embodiment shows the adaptation of a rectangular arrangement of semiconductor chips 104 to a round boundary 118 in the case of optoelectronic components. For the rest, the exemplary embodiment corresponds to the exemplary embodiment shown in FIG. 2a.

Figure 6B:
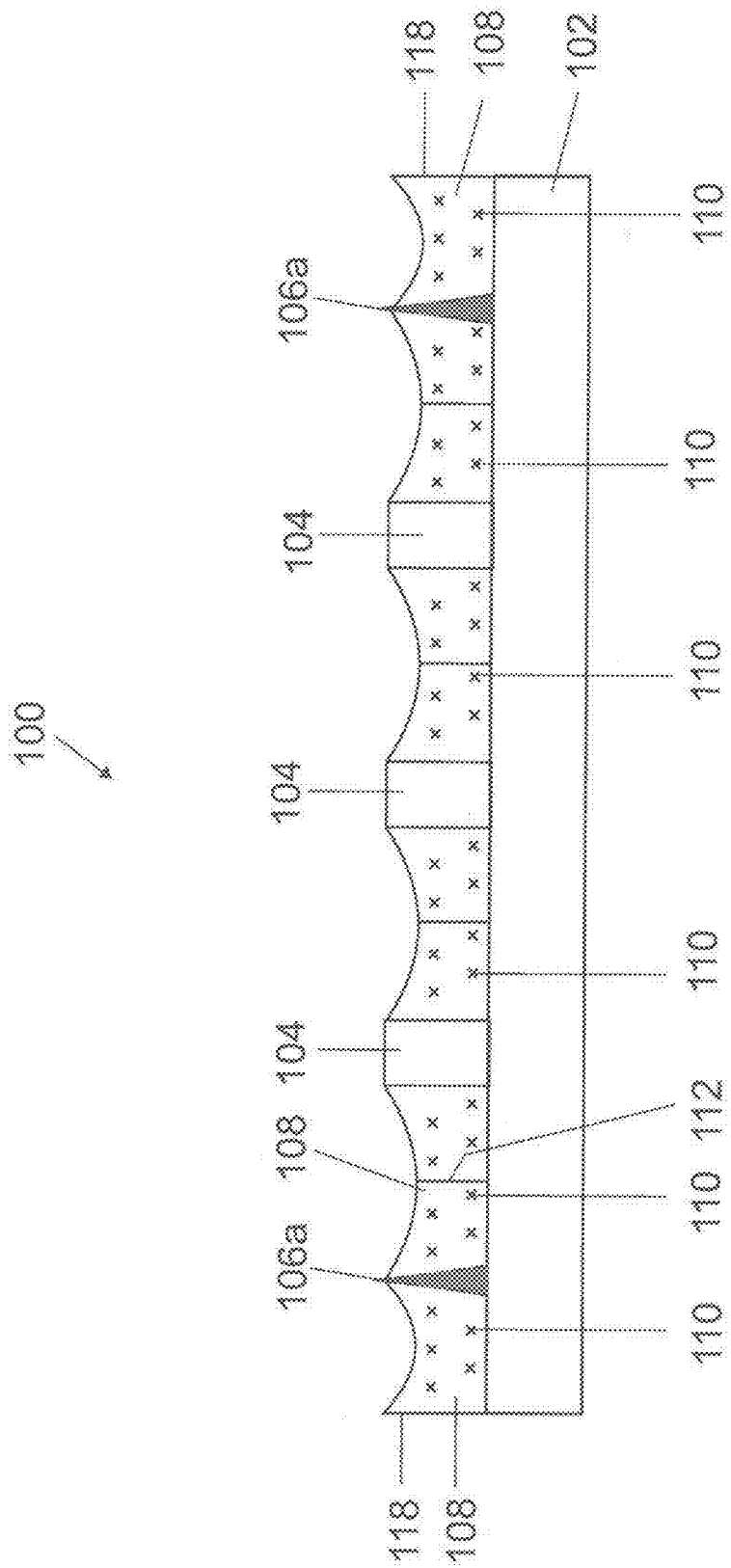
FIG. 6b shows the exemplary embodiment of the optoelectronic component from FIG. 6a in sectional view.

FIG. 6b shows the exemplary embodiment of the optoelectronic component from FIG. 6a in sectional view. Along the sectional axis 120, three semiconductor chips 104 are arranged approximately equidistantly between two bonding wires 106a. For the rest, the exemplary embodiment corresponds to the exemplary embodiment shown in FIG. 2b.

FIG. 7a shows an exemplary embodiment of an optoelectronic component in plan view. This exemplary embodiment is an alternative exemplary embodiment to the exemplary embodiment from FIG. 6a. The boundary 118 of the optoelectronic component is round. This exemplary embodiment serves for adapting rectangular chip arrangements to round boundaries. In the center, a multiplicity of semiconductor chips 104 are arranged in a rectangular shape. The attractor element 106c is a delimiting element and is arranged around the rectangular array of semiconductor chips 104. The delimiting element 106c completely encloses the array of semiconductor chips 104. The delimiting element 106c consists of polybutylene terephthalate (PBT).

Figure 7B:
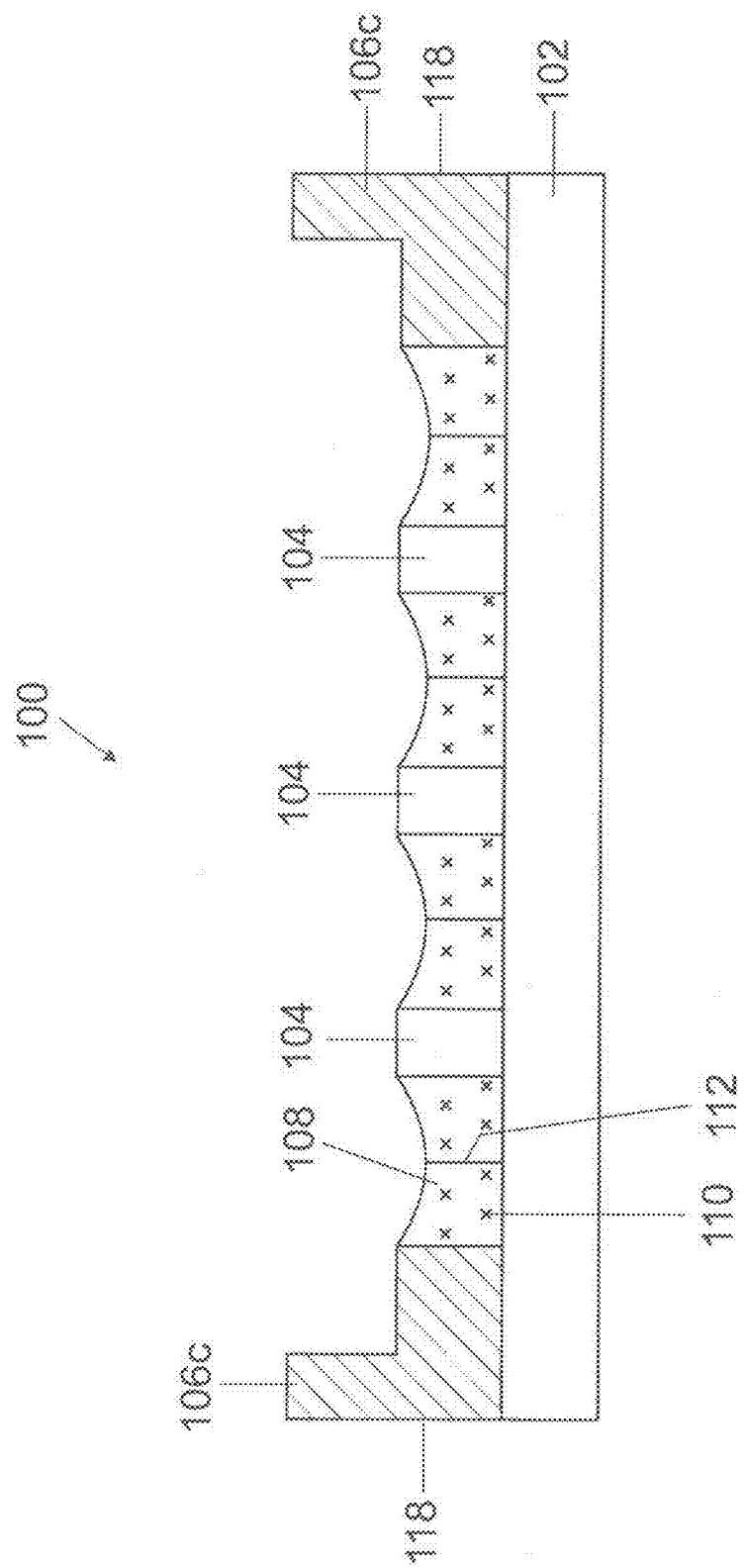
FIG. 7b shows the exemplary embodiment of the optoelectronic component from FIG. 7a in sectional view.

FIG. 7b shows the exemplary embodiment of the optoelectronic component from FIG. 7a in sectional view. Along the sectional axis 120, three semiconductor chips 104 are arranged approximately equidistantly from one another in the cutout of the delimiting element 106c. The delimiting element 106c has a base having approximately the same height as the semiconductor chips 104. The circumferential base of the delimiting elements 106c is bordered by an elevated, circumferential edge 118.

Figure 8A:
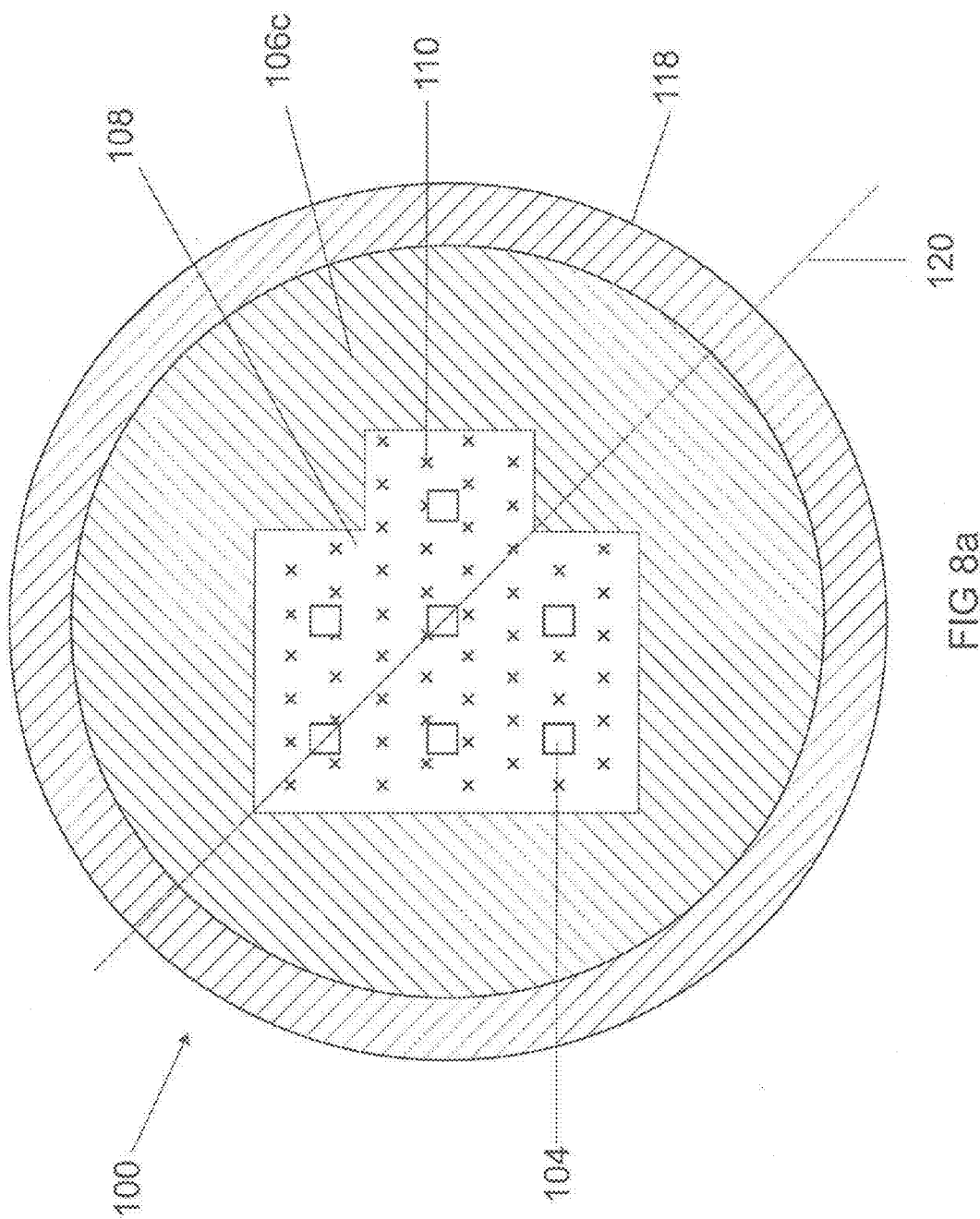
FIG. 8a shows an exemplary embodiment of an optoelectronic component in plan view.

FIG. 8a shows an exemplary embodiment of an optoelectronic component in plan view. An irregular arrangement of semiconductor chips 104 on a substrate having a round boundary 118 is shown. The delimiting element 106c has an angled form toward the semiconductor chips 104. This form ensures that the distance between the semiconductor chips 104 and the attractor element is approximately identical for each semiconductor chip 104. For the rest, the exemplary embodiment corresponds to the exemplary embodiment shown in FIG. 7a.

FIG. 8b shows the exemplary embodiment of the optoelectronic component from FIG. 8a in sectional view. What is achieved by means of the non-uniformly shaped delimiting element 106c is that the minimum thickness 112 of the medium 108 is approximately identical between all semiconductor chips 104 and the delimiting element 106c. This ensures uniform reflective properties over the entire extent of the optoelectronic component. For the rest, the exemplary embodiment corresponds to the exemplary embodiment shown in FIG. 7b.

Figure 9A:
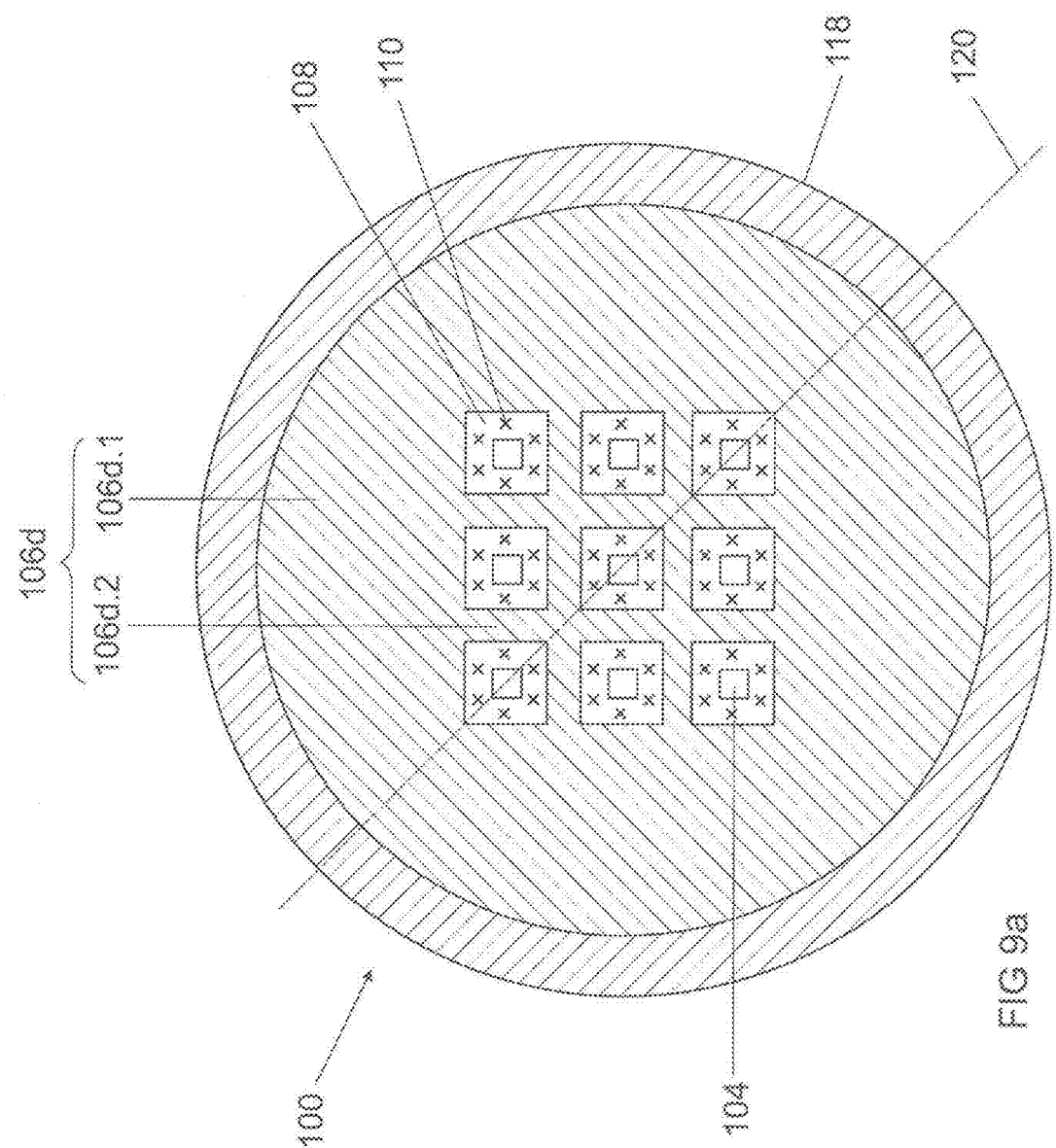
FIG. 9a shows an exemplary embodiment of an optoelectronic component in plan view.

FIG. 9a shows an exemplary embodiment of an optoelectronic component in plan view. The boundary 118 of the optoelectronic component is round. This exemplary embodiment serves for adapting rectangular chip arrangements to round boundaries. The attractor element 106d embodied in one-piece has a delimiting element 106d.1 and a grid-shaped inner structure 106d.2. The grid-shaped inner structure 106d.2 forms regularly arranged webs between the semiconductor chips 104. The delimiting element 106d.1 is arranged around the rectangular array of semiconductor chips 104. The delimiting element 106d.1 and the grid-shaped inner structure 106d.2 consist of polybutylene terephthalate (PBT).

Figure 9B:
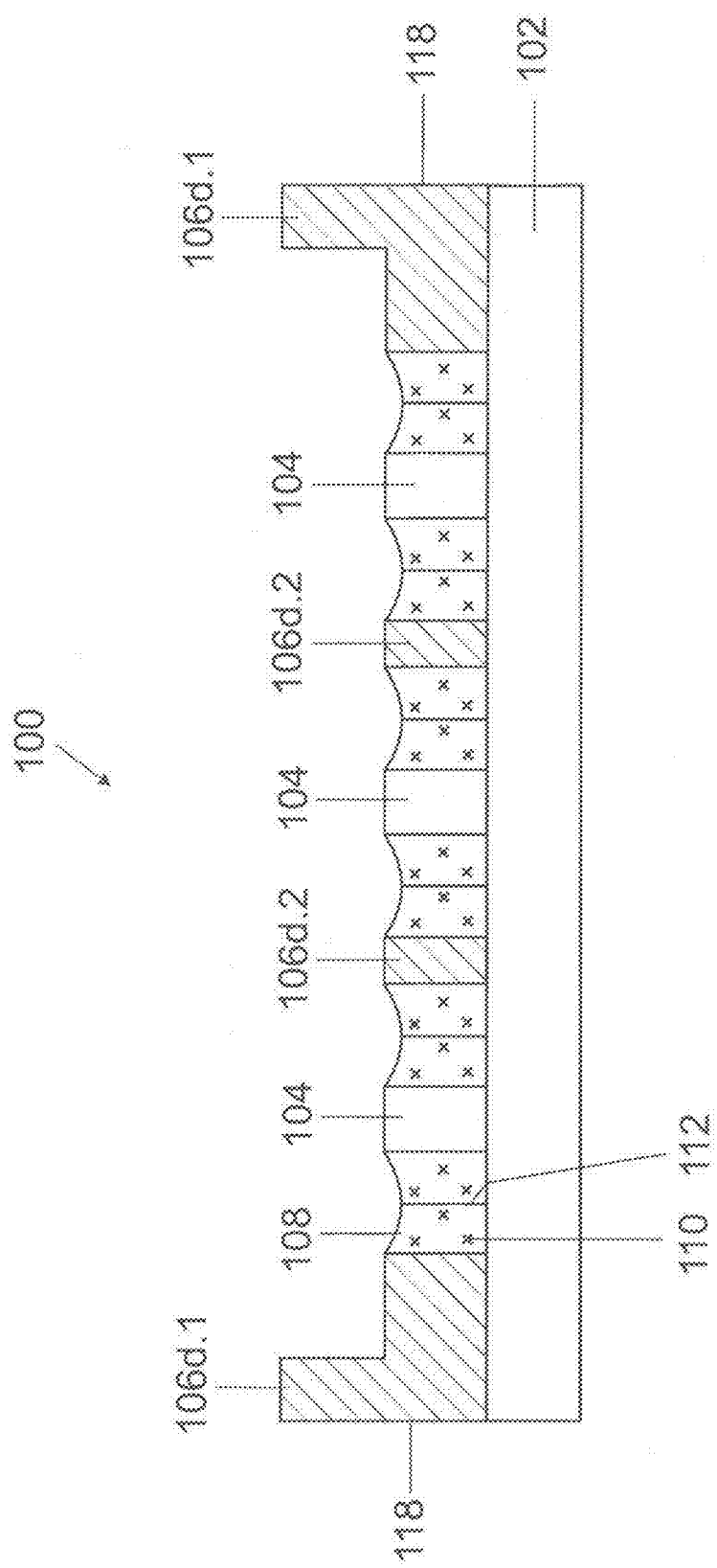
FIG. 9b shows the exemplary embodiment of the optoelectronic component from FIG. 9a in sectional view.

FIG. 9b shows the exemplary embodiment from FIG. 9a in sectional view. Along the sectional axis 120, three semiconductor chips 104 are arranged in the cutouts of the attractor element 106d. The delimiting element 106d.1 has a base having approximately the same height as the semiconductor chips 104. The circumferential base of the delimiting element 106d.1 is bordered by a raised, circumferential edge 118. An inner structure 106d.2 is arranged between the semiconductor chips 104 in such a way that the distance from the semiconductor chips 104 to the delimiting element 106d.1 and to the inner structure 106d.2 is approximately uniform. What is achieved by means of these uniform distances is that the minimum thickness 112 of the medium 108 between the semiconductor chips 104 and the attractor element 106d.1, 106d.2 is of approximately the same magnitude at all locations.

Figure 10A:
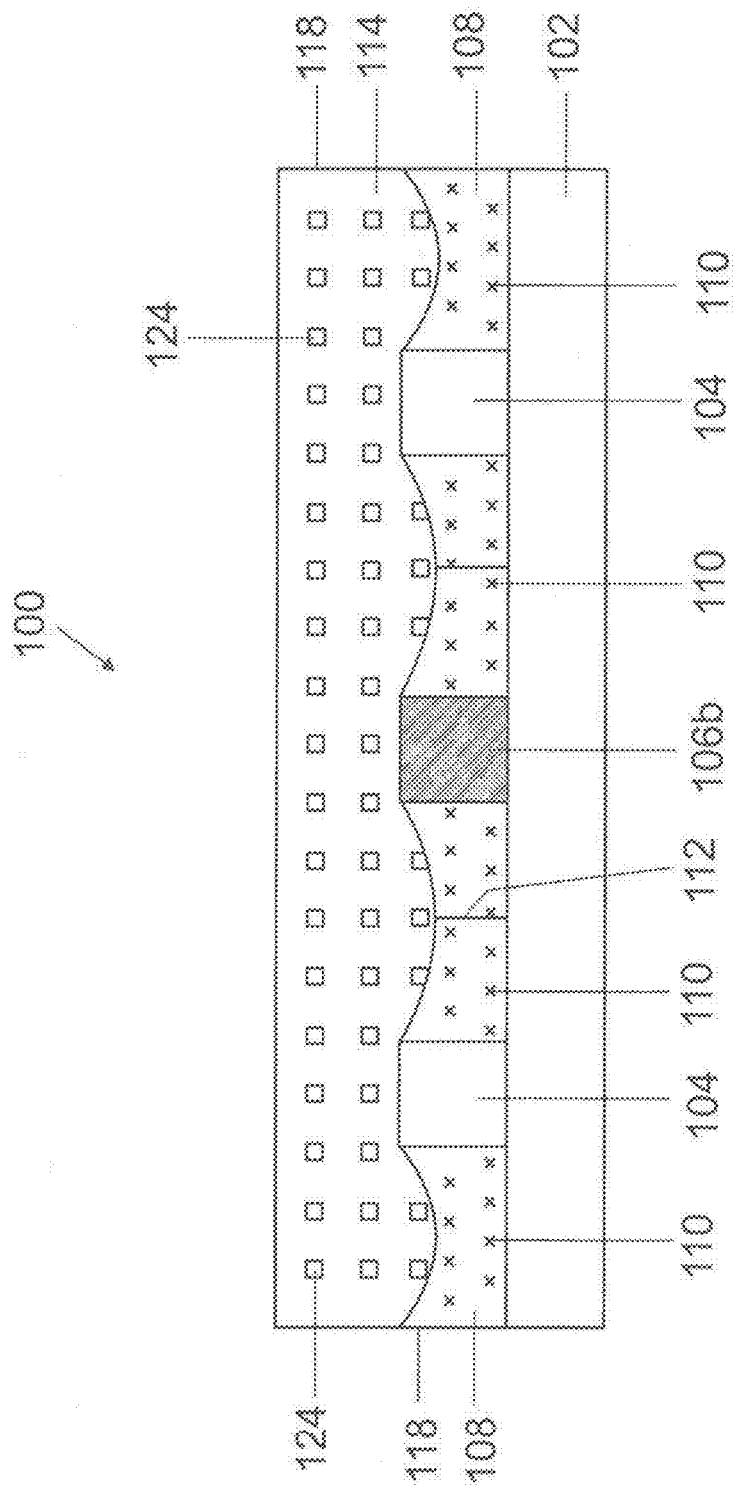
FIG. 10a shows an exemplary embodiment of an optoelectronic component in sectional view.

FIG. 10a shows an exemplary embodiment of an optoelectronic component in sectional view. The exemplary embodiment in FIG. 10a is a development of the exemplary embodiment shown in FIG. 3b. The pigments 110 are white pigments. A layer 114 comprising luminophore particles 124 is applied above the medium 108, above the semiconductor chips 104 and above the blocky attractor element 106b. The luminophore particles can comprise yttrium aluminum garnet (YAG). The semiconductor chips 104 emit blue primary light. Part of the primary light is converted into secondary light from the yellow-green spectral range by the luminophore particles 124. Part of the blue primary light and of the yellow-green secondary light is backscattered onto the medium 108. The white pigments 110 reflect primary and secondary light equally. The reflected primary and secondary light can be coupled out from the optoelectronic component. The light power of the optoelectronic component can be significantly increased by the use of the medium 108 filled with white pigments 110 and having a minimum thickness 112 of 10% of the height of the adjacent semiconductor chip 104 or of the adjacent attractor element 106b.

FIG. 10b shows an exemplary embodiment of an optoelectronic component in sectional view. FIG. 10b is a development of the exemplary embodiment in FIG. 10a. A layer 116 comprising diffuser particles 122 is applied to the layer 114 comprising luminophore particles 124. The diffuser particles 122 comprise aluminum oxide ($Al_2O_3$). The diffuser particles 122 scatter both primary light and secondary light without altering the wavelength of the light. The layer 116 serves for better mixing of primary and secondary light. In the case of blue primary and yellow secondary light, the optoelectronic component emits homogeneous white light homogeneously over the entire surface of the optoelectronic component.

Figure 10C:
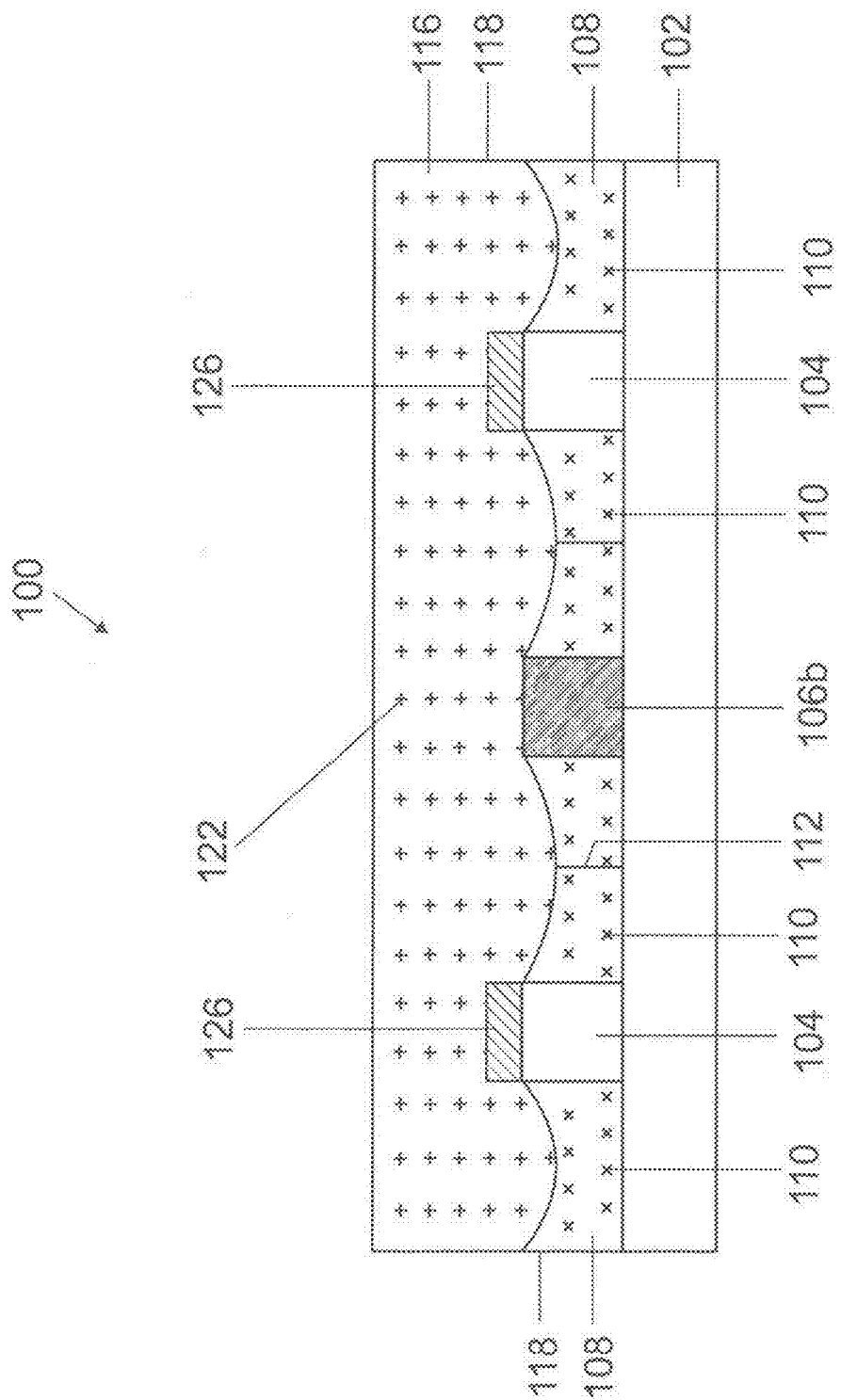
FIG. 10c shows an exemplary embodiment of an optoelectronic component in sectional view.

FIG. 10c shows an exemplary embodiment of an optoelectronic component in sectional view. FIG. 10c shows an alternative embodiment to the exemplary embodiments illustrated in FIGS. 10a and 10b. In this case, a respective converter lamina 126 is directly applied to that area of the semiconductor chips 104 which faces away from the substrate. The converter laminae 126 are embodied as converter-filled silicone laminae. Luminophore particles 124 serve as converter. The luminophore can be embedded into the silicone lamina. Alternatively, the lamina can be embodied as a sintered ceramic lamina in which the luminophore is embedded into the ceramic lamina. The luminophore particles comprise phosphorescent materials. The phosphorescent materials can comprise yttrium aluminum garnet or orthosilicates. The so-called layer transfer is described by way of example in International Patent Publication No. WO 2010/017831. This so-called near-chip conversion is advantageous since the electromagnetic radiation is converted in a focal plane with the chip. The layer 116 comprising diffuser particles 122 is applied directly to the converter laminae 126, to the attractor element 106b and to the medium 108 filled with pigments 110. Said layer 116 mixes the blue primary light and the yellow-green secondary light. This once again results in homogeneous white light that is emitted homogeneously over the area of the optoelectronic component.

Figure 10D:
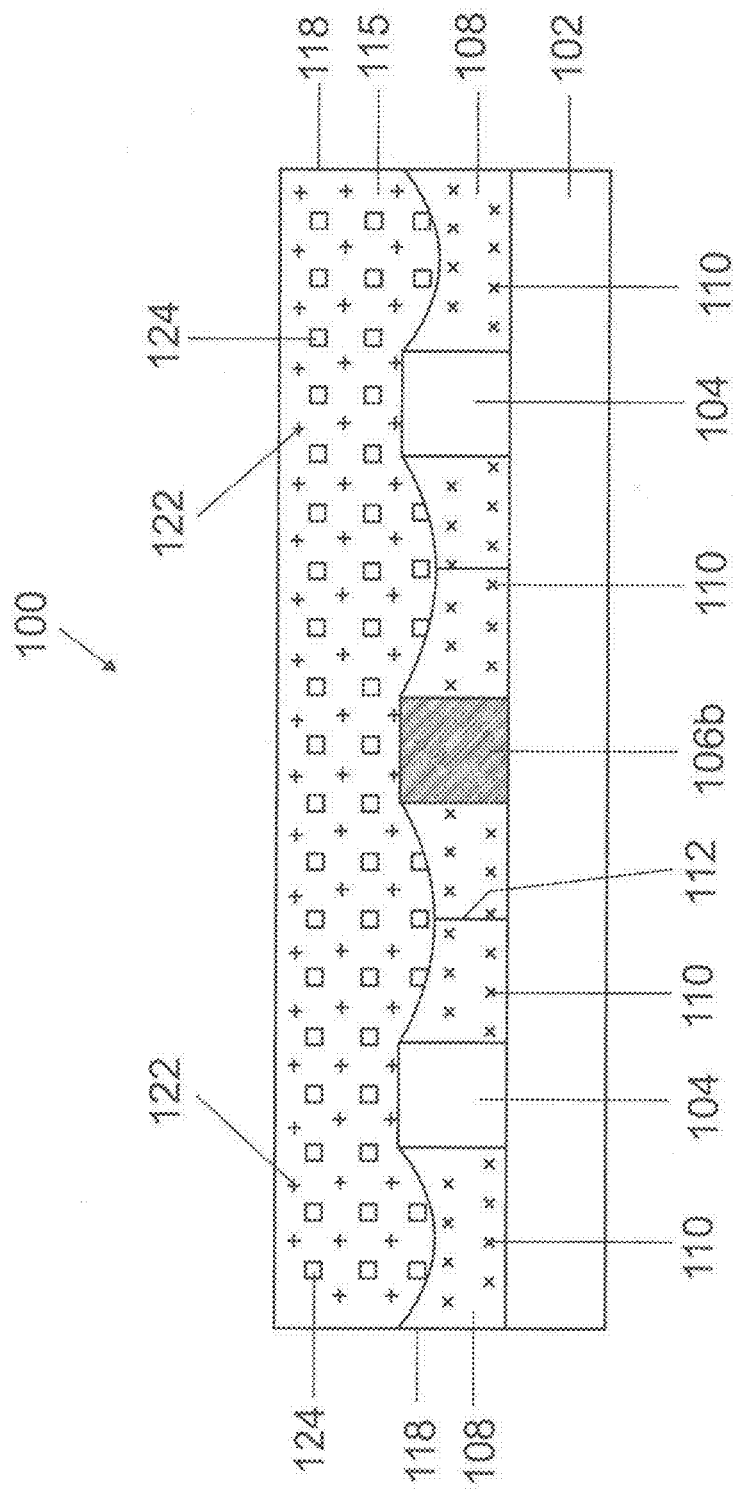
FIG. 10d shows an exemplary embodiment of an optoelectronic component in sectional view.

FIG. 10d shows an exemplary embodiment of an optoelectronic component in sectional view. FIG. 10d shows an alternative embodiment to the exemplary embodiments illustrated in FIGS. 10a, 10b and 10c. Instead of two separate layers 114 and 116, a single layer 115 is provided, which comprises both luminophore particles 124 and diffuser particles 122. The luminophore particles 124 and the diffuser particles 122 are intermixed and distributed approximately homogeneously in the layer 115.

The invention claimed is:

1. An optoelectronic component comprising:
    a substrate;
    a semiconductor chip arranged on the substrate;
    a wettable attractor element arranged on the substrate;
    a medium comprising pigments, the medium at least regionally covering an exposed region of the substrate that is not covered by the semiconductor chip and the attractor element and at least partly wetting the semiconductor chip and the attractor element; and
    a further semiconductor chip, wherein the attractor element is arranged between the semiconductor chip and the further semiconductor chip; and
    wherein the semiconductor chip and the further semiconductor chip each compromise a light-emitting surface, wherein the medium at least partly wets side areas of the semiconductor chips, and wherein the light-emitting surfaces of the semiconductor chips are not wetted by the medium.

2. The optoelectronic component according to claim 1, wherein the medium comprising pigments has a minimum thickness above the substrate of at least 10% of a smaller height of attractor element and of semiconductor chip above the substrate.

3. The optoelectronic component according to claim 1, wherein the attractor element has a height above the substrate of 10% to 300% of a height of the semiconductor chip.

4. The optoelectronic component according to claim 1, wherein the attractor element is arranged centrally between the semiconductor chip and the further semiconductor chip and has a height above the substrate between 80% and 120% of a height of the semiconductor chip.

5. The optoelectronic component according to claim 1, wherein the medium comprises at least one material selected from the group consisting of:
   silicone;
   epoxy resin; and
   hybrid materials.

6. The optoelectronic component according to claim 1, wherein the medium is filled with white pigments which are composed of at least one material selected from the group consisting of:
   titanium dioxide ($TiO_2$);
   aluminum oxide ($Al_2O_3$); and
   zirconium oxide ($ZrO$).

7. The optoelectronic component according to claim 1, wherein the medium is filled with black pigments which are composed of at least one material selected from the group consisting of:
   carbon black particles; and
   graphite particles.

8. The optoelectronic component according to claim 1, wherein the medium is filled with chromatic pigments.

9. The optoelectronic component according to claim 1, further comprising a layer comprising luminophore particles or a layer comprising diffuser particles overlying on an area of the semiconductor chip facing away from the substrate, on an area of the attractor element facing away from the substrate and on the medium.

10. A method for producing an optoelectronic component according to claim 1, the method comprising:
   providing a substrate with a semiconductor chip and a further semiconductor chip arranged thereon;
   arranging a wettable attractor element over the substrate;
   at least regionally applying a liquid medium comprising pigments to an exposed region of the substrate that is not covered by the semiconductor chip, the further semiconductor chip and the attractor element, wherein the semiconductor chip, the further semiconductor chip and the attractor element are at least partly wetted; and
   curing the liquid medium.

11. The method according to patent claim 10, wherein the liquid medium is applied by dispensing.

12. An optoelectronic component comprising:
   a substrate;
   a semiconductor chip arranged on the substrate;
   a wettable attractor element arranged on the substrate; and
   a medium comprising pigments, the medium at least regionally covering an exposed region of the substrate that is not covered by the semiconductor chip and the attractor element and at least partly wetting the semiconductor chip and the attractor element;
   wherein the medium is filled with one of chromatic pigments or black pigments, wherein the black pigments are composed of at least one material selected from a group consisting of carbon black particles and graphite particles.

13. An optoelectronic component comprising:
   a substrate;
   a semiconductor chip arranged on the substrate;
   a wttable attractor element arranged on the substrate; and
   a medium comprising pigments, the medium at least regionally covering an exposed region of the substrate that is not covered by the semiconductor chip and the attractor element and at least partly wetting the semiconductor chip and the attractor element,
   wherein at least one of:
      the attractor element has a bonding wire;
      the attractor element is composed of polybutylene terephthalate (PBT);
      the attractor element has a delimiting element and an inner structure, wherein the delimiting element and the inner structure are embodied in one piece;
      the attractor element has an inner structure that has the form of a grid; and
      the component comprises a plurality of semiconductor chips including said semiconductor chip and a plurality of attractor elements including said wettable attractor element, wherein distances between adjacent semiconductor chips, between adjancet attractor element as well as between adjacent semiconductor chips and adjancet attractor elements are uniform.

* * * * *